(12) United States Patent
Hatakeyama et al.

(10) Patent No.: US 8,652,756 B2
(45) Date of Patent: Feb. 18, 2014

(54) POSITIVE RESIST COMPOSITION AND PATTERNING PROCESS

(75) Inventors: Jun Hatakeyama, Jyoetsu (JP); Daisuke Kori, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/586,602

(22) Filed: Aug. 15, 2012

(65) Prior Publication Data

US 2013/0056654 A1    Mar. 7, 2013

(30) Foreign Application Priority Data

Sep. 6, 2011 (JP) ................................. 2011-193819
May 16, 2012 (JP) ................................. 2012-112628

(51) Int. Cl.
*G03C 1/00* (2006.01)
*G03F 1/00* (2012.01)

(52) U.S. Cl.
USPC ...................................... 430/270.1; 430/326

(58) Field of Classification Search
USPC .............................................. 430/270.1–326
See application file for complete search history.

(56) References Cited

U.S. PATENT DOCUMENTS

| | | | |
|---|---|---|---|
| 5,372,912 A | 12/1994 | Allen et al. | |
| 6,448,420 B1 | 9/2002 | Kinsho et al. | |
| 2007/0042292 A1 | 2/2007 | Yoneda et al. | |
| 2007/0231708 A1 | 10/2007 | Matsumaru et al. | |
| 2007/0231738 A1 | 10/2007 | Kaneko et al. | |
| 2008/0090172 A1 | 4/2008 | Hatakeyama et al. | |
| 2008/0118860 A1 | 5/2008 | Harada et al. | |
| 2008/0153030 A1 | 6/2008 | Kobayashi et al. | |
| 2008/0241736 A1 | 10/2008 | Kobayashi et al. | |

FOREIGN PATENT DOCUMENTS

| | | |
|---|---|---|
| CA | 2049772 A1 | 2/1992 |
| JP | A-230645 | 8/1992 |
| JP | A-5-134415 | 5/1993 |
| JP | A-2000-327633 | 11/2000 |
| JP | A-2005-84365 | 3/2005 |
| JP | A-2006-45311 | 2/2006 |
| JP | B2-3790649 | 6/2006 |
| JP | A-2006-178317 | 7/2006 |
| JP | B2-3796568 | 7/2006 |
| JP | B2-3829913 | 10/2006 |
| JP | A-2007-79552 | 3/2007 |
| JP | A-2007-297590 | 11/2007 |
| JP | A-2008-111103 | 5/2008 |
| JP | A-2008-122932 | 5/2008 |
| JP | A-2008-158339 | 7/2008 |
| JP | A-2008-197606 | 8/2008 |
| JP | A-2008-239918 | 10/2008 |
| JP | A-2008-249993 | 10/2008 |

*Primary Examiner* — Cynthia H Kelly
*Assistant Examiner* — Connie P Johnson
(74) *Attorney, Agent, or Firm* — Oliff PLC

(57) ABSTRACT

A positive resist composition comprising, as base resins contained therein, (A) a polymer having a weight-average molecular weight of 1000 to 500000 and containing a repeating unit which contains a structure having a hydrogen atom of a carboxyl group thereof substituted with an acid-labile group having a cyclic structure and (B) a novolak resin of a substituted or an unsubstituted fluorescein, and in addition, a photo acid generator. There can be provided a positive resist composition having an appropriate absorption to form a pattern on a highly reflective substrate with excellent pattern profile after light exposure, adhesion, implantation characteristics onto a non-planar substrate, and in addition, ion implantation resistance at the time of ion implantation; and to provide a patterning process.

19 Claims, No Drawings

POSITIVE RESIST COMPOSITION AND PATTERNING PROCESS

BACKGROUND OF THE INVENTION

1. Field of the Invention

The present invention relates to a positive resist composition, in particular, a chemically amplified positive resist composition suitable for an ion implantation process; and to a patterning process using this positive resist composition.

2. Description of the Related Art

In recent years, as LSI progresses toward higher integration and further acceleration in speed, miniaturization of a pattern rule is required. In the light exposure used as a general technology nowadays, resolution inherent to wavelength of a light source is approaching to its limit. In 1980s, a g-line (436 nm) or an i-line (365 nm) of a mercury lamp was used as an exposure light at the time of forming a resist pattern. As a mean for further miniaturization, shifting to a shorter wavelength of an exposing light was assumed to be effective. As a result, in a mass production process after DRAM (Dynamic Random Access Memory) with 64-megabits (0.25 µm or less of a processing dimension) in 1990s, a KrF excimer laser (248 nm), a shorter wavelength than an i-line (365 nm), was used in place of an i-line as an exposure light source. However, in production of DRAM with an integration of 256 M and higher than 1 G which require further miniaturized process technologies (process dimension of 0.2 µm or less), a light source with a further short wavelength is required, and thus, a photo lithography using an ArF excimer laser (193 nm) has been seriously investigated since about a decade ago. At first, an ArF lithography was planned to be applied to a device-manufacturing starting from a 180-nm node device, but a KrF excimer laser lithography lived long to a mass production of a 130-nm node device, and thus a full-fledged application of an ArF lithography started from a 90-nm node. Further, a study of a 65-nm node device by combining with a lens having an increased NA till 0.9 is now underway. Further shortening of wavelength of an exposure light is progressing towards the next 45-nm node device, and for that an $F_2$ lithography with a 157-nm wavelength became a candidate. However, there are many problems in an $F_2$ lithography; an increase in cost of a scanner due to the use of a large quantity of expensive $CaF_2$ single crystals for a projector lens, extremely poor sustainability of a soft pellicle, which leads to a change of an optical system due to introduction of a hard pellicle, a decrease in an etching resistance of a resist film, and the like. Because of these problems, it was proposed to postpone an $F_2$ lithography and to introduce an ArF immersion lithography earlier.

In an ArF immersion lithography, a proposal is made to impregnate water between a projector lens and a wafer. A refractive index of water at 193 nm is 1.44, and therefore a pattern formation is possible even if a lens with a numerical aperture (NA) of more than 1.0 is used, and moreover, theoretically NA may be increased to near 1.44. In the beginning, deterioration of a resolution and a shift of a focus due to a change of refractive index associated with a change of water temperature were pointed out. However, the problems associated with the change in the refractive index have been solved by controlling the water temperature within 1/100° C. In addition, it was also confirmed that the effect of heat generation from a resist film by light exposure was almost insignificant. As to the concern of a pattern transcription of microbubbles in water, it was also confirmed that formation of bubbles from a resist film by light exposure was insignificant if water is fully degassed. In the early period of an immersion lithography in 1980s, a proposal was made to immerse an entire stage into water. However, a partial fill method having a nozzle of water supply and of drainage in which water is introduced only between a projector lens and a wafer in order to meet the movement of a high-speed scanner was adopted. By an immersion method using water, designing of a lens with NA of 1 or higher became theoretically possible. However, there appeared a problem in it that a lens dimension in an optical system based on a conventional refractive index system becomes extraordinary large thereby leading to distortion of a lens due to its own weight. A proposal was made to design a catadioptric optical system for a more compact lens, which accelerated a speed in designing a lens having NA of 1.0 or more. Now, mass-production of a device with a 45-nm node is underway by combining a lens having NA of 1.35 with a super resolution technology.

To form a p-well and an n-well of a CMOS device, implantation of an ion is sometimes performed by using a KrF resist pattern as a mask; however, use of an ArF resist pattern has been investigated as progress of miniaturization continues. To perform ion implantation, surface of a substrate in a space portion of a resist pattern needs to be exposed. This is because, if an anti-reflection coating (BARC) layer exists under a resist film, an ion is trapped in the BARC layer. However, if patterning of a resist film is performed without BARO, a standing wave due to substrate reflection is generated thereby causing a significant concavity and convexity on a side wall of the resist pattern after development. To smooth this irregularity caused by the standing wave, use of an acid generator (PAG) to generate an acid having small molecular weight so as to increase acid diffusion thereby readily diffusible, or application of high temperature PEB is considered to be effective. In the size of 200 to 300 nm to which the ion implantation resist pattern of KrF exposure can resolve, there was no deterioration of a resolution due to increase of acid diffusion; but in the size of 200 nm or less to which the ion implantation resist pattern of ArF exposure can resolve, there appears undesirable effects such as deterioration of a resolution due to acid diffusion and increase of a proximity bias.

Use of a resist which contains a dye to avoid generation of a standing wave by letting a photoresist itself have absorption is the most classical way; and investigation thereof has been carried out since the novolak resist of an i-line and a g-line. As to the absorbing ingredient used in the ArF exposure, studies are made on introduction of a benzene ring into a polymer and on an additive which contains a benzene ring. However, the standing wave cannot be completely avoided by the absorbing ingredient; and further, if absorption is made larger, there appears a problem of a tapered trapezoidal form in a cross section of the resist pattern even though the standing wave can be reduced.

A naphthalene ring has a higher etching resistance than a benzene ring; and thus, application thereof to a resist polymer has been attempted (Patent document 1 and 2). Especially, a naphthalene ring or an acenaphthene having a hydroxyl group has a merit of improved adhesion to a substrate as compared with an adhesion group having only a lactone ring.

An ion implantation resist composition to form a pattern by a KrF exposure, wherein a blend of a cresol novolak with a methacrylate having an acid-labile group is used, is proposed (Patent document 3). In this case, there is an economical merit because a cheap cresol novolak resin can be used; but, this cannot be applied to an ArF exposure because the cresol novolak has a strong absorption.

An ion implantation resist composition added with a hydroxy naphthalene or a dihydroxy naphthalene, the both being substituted or unsubstituted with an acid-labile group, is proposed (Patent document 4). Implantation characteristics onto a non-planar substrate can be improved by addition of a monomer component thereinto. However, a naphthalene is prone to sublime so that the naphthalene component contained therein may evaporate during baking; and thus, there is a risk of causing a problem of attachment thereof to the ceiling of a hot plate.

An ion implantation resist composition containing a naphthalene ring and an acenaphthene is proposed (Patent document 5). A polymer which is obtained by copolymerization of a monomer containing a naphthalene, an acenaphthylene, a monomer containing an acid-labile group, and a monomer containing an adhesive group of a lactone is used as a base polymer therein. Here, if the naphthalene has a hydroxyl group, adhesion with a substrate improves; but, there is no improvement in implantation characteristics.

A resist composition for a thick film which is a blend of a t-butyl(meth)acrylate with a novolak resin is proposed (Patent document 6). Here, a novolak resin using a dihydroxy naphthalene is mentioned as the novolak resin. However, if this is used for ion implantation, an acid-labile group of the t-butyl group is poor in dissolution-preventing power thereby leading to poor lithography; and thus, there is a problem of poor masking function at the time of ion implantation.

A KrF resist and an EB resist added with a phenol phthalein, a phenol red, a naphtholphthalein, or a fluorescein as a dissolution-preventing agent, wherein a hydrogen atom of a hydroxyl group in them is substituted with an acid-labile group, are proposed (Patent document 7). It is described therein that a phenol phthalein, a phenol red, a naphtholphthalein, and a fluorescein generate a carboxyl group or a sulfo group in an aqueous alkaline solution thereby accelerating dissolution rate of an exposed area along with de-protection of the acid.

CITATION LIST

Patent Literature

Patent document 1: Japanese Patent No. 3829913
Patent document 2: Japanese Patent No. 3796568
Patent document 3: U.S. Pat. No. 5,372,912
Patent document 4: Japanese Patent Laid-Open Publication No. 2007-79552
Patent document 5: Japanese Patent Laid-Open Publication No. 2008-197606
Patent document 6: Japanese Patent Laid-Open Publication No. 2008-249993
Patent document 7: Japanese Patent Laid-Open Publication No. H05-134415

SUMMARY OF THE INVENTION

The present invention is made in view of the situation as mentioned above, and has objects to provide a positive resist composition having an appropriate absorption to form a pattern on a highly reflective substrate with excellent pattern profile after light exposure, adhesion, implantation characteristics onto a non-planar substrate, and in addition, ion implantation resistance at the time of ion implantation; and to provide a patterning process.

To solve the problems as mentioned above, according to the present invention, provided is a positive resist composition comprising, as base resins contained therein, (A) a polymer having a weight-average molecular weight of 1000 to 500000 and containing a repeating unit which contains a structure having a hydrogen atom of a carboxyl group thereof substituted with an acid-labile group having a cyclic structure and (B) a novolak resin of a substituted or an unsubstituted fluorescein, and in addition, a photo acid generator.

A positive resist composition using, as the base resins contained therein, a blend of the polymer of the component (A) with the fluorescein novolak resin of the component (B) is excellent in resolution especially on a non-planar substrate having high reflection, in implantation characteristics and adhesion, in process conformity, and in a pattern profile after light exposure. In addition, the composition has an ion implantation resistance at the time of ion implantation.

As to the repeating unit which is contained in the polymer of the component (A) and contains a structure having a hydrogen atom of a carboxyl group thereof substituted with an acid-labile group having a cyclic structure, a repeating unit "a" shown by the following general formula (1) is preferable,

(1)

wherein $R^1$ represents a hydrogen atom or a methyl group. X represents a single bond, a naphthylene group, or a connecting group having 1 to 14 carbon atoms and containing one, or two or more groups selected from an ester group, an ether group, and a lactone ring; and $R^2$ represents the acid-labile group having a foregoing cyclic structure.

As mentioned above, the repeating unit which is contained in the polymer of the component (A) and contains a structure having a hydrogen atom of a carboxyl group thereof substituted with an acid-labile group having a cyclic structure has preferably a structure having the hydrogen atom of the carboxyl group thereof substituted with the acid-labile group $R^2$ having a cyclic structure, as shown by the general formula (1).

In addition, the novolak resin of a substituted or an unsubstituted fluorescein of the component (B) is preferably a resin having a repeating unit shown by the following general formula (2) and a weight-average molecular weight of 400 to 20000,

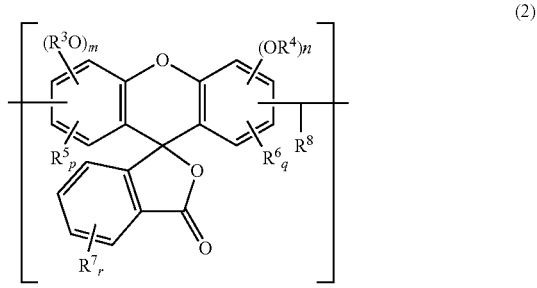

(2)

wherein $R^3$ and $R^4$ represent a hydrogen atom or an acid-labile group. $R^5$, $R^6$, and $R^7$ represent any of a hydrogen atom, a trifluoromethyl group, a hydroxyl group, a nitro group, a cyano group, and a halogen atom; a linear, a branched, or a cyclic alkyl group having 1 to 10 carbon atoms; an alkenyl group having 2 to 10 carbon atoms; and an aryl group having 6 to 10 carbon atoms, provided that the alkyl group, the alkenyl group, and the aryl group may optionally contain any of a hydroxyl group, an alkoxy group, an acyloxy group, an ether group, and a sulfide group. $R^8$ represents any of a linear, a branched, or a cyclic alkyl group having 1 to 6 carbon atoms; an alkenyl group having 2 to 10 carbon atoms; a heteroaryl group having 4 to 10 carbon atoms; and an aryl group having 6 to 10 carbon atoms, provided that the alkyl group, the alkenyl group, the heteroaryl group, and the aryl group may optionally contain any of a hydroxyl group, an alkoxy group, an ether group, and a thioether group. m, n, p, q, and r represent 1 or 2.

The novolak resin of a substituted or an unsubstituted fluorescein in the component (B) is preferably the resin having a repeating unit shown by the general formula (2) and a weight-average molecular weight of 400 to 20000, as mentioned above.

In addition, it is preferable that the component (A) be a polymer containing, in addition to the repeating unit "a" shown by the general formula (1), a repeating unit "b" which has an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, and an amide group (each molar ratio of the repeating unit "a" and the repeating unit "b" relative to entirety of the repeating units contained in the polymer is in the range of $0<a<1.0$, $0<b<1.0$, and $0.2 \leq a+b \leq 1.0$), and that the component (B) be a novolak resin of a fluorescein having a repeating unit shown by the general formula (2).

It is preferable that the component (A) contain, in addition to the repeating unit "a" shown by the general formula (1), a repeating unit "b" which contains an adhesion group as mentioned above, because adhesion to a substrate is further enhanced.

In addition, it is preferable that the positive resist composition further contain an organic solvent. Further, it is preferable that the positive resist composition contain any one of a basic compound and a surfactant or both as an additive.

Accordingly, blending of an organic solvent thereinto improves, for example, applicability of the resist composition onto a substrate; blending of a basic compound suppresses diffusion rate of an acid in the resist film thereby increases resolution further; and blending of a surfactant improves or controls applicability of a resist composition further.

In addition, the present invention provides a patterning process, wherein the process includes a step of applying the positive resist composition onto a substrate; after heat treatment, a step of exposure to a high energy beam; and a step of development by using a developer.

The patterning process which uses the positive resist composition of the present invention as mentioned above enables to form a resist pattern having excellent rectangularity and adhesion, and in addition, suppressed side-wall roughness.

Here, an ArF excimer laser is preferably used as the high energy beam.

A base resin which contains the component (B) as mentioned above has an appropriate absorbance especially at 193 nm of an ArF excimer laser among the high energy beams; and thus, use of an ArF excimer laser as the high energy beam is preferable.

In addition, it is preferable that implantation of an ion onto the substrate be carried out after the step of development by using a developer.

When implantation of an ion onto the substrate is carried out by using, as a mask, a resist pattern formed by development with a developer as mentioned above, ion implantation can be carried out. The positive resist composition of the present invention has an ion implantation resistance; and thus, ion implantation can be carried out without problems.

The positive resist composition of the present invention is excellent in resolution on a highly reflective non-planar substrate, sensitivity, implantation properties, and adhesion to a substrate; and in addition, the composition gives excellent pattern profile and edge roughness after light exposure. In addition, the composition has an ion implantation resistance at the time of ion implantation. Accordingly, a positive resist composition, especially a chemically amplified positive resist composition, especially useful for manufacturing of a VLSI circuit or useful as a fine patterning material of a photomask by an EB drawing, can be obtained.

DESCRIPTION OF THE PREFERRED EMBODIMENTS

Hereinafter, the present invention will be explained in more detail.

As mentioned above, a positive resist composition, having an appropriate absorption to form a pattern on a highly reflective substrate, having excellent pattern profile after light exposure, adhesion, and implantation properties on a non-planar substrate, and in addition, having an ion implantation resistance at the time of ion plantation, has been wanted.

In order to achieve the objects as mentioned above, inventors of the present invention carried out an extensive investigation to obtain a resist composition with which ion implantation may be carried out after patterning by using ArF exposure, which is required in recent years.

Inventors of the present invention thought of using a fluorescein which has an appropriate absorption at 193 nm of an ArF excimer laser because light exposure is made on a highly reflective substrate. However; if a fluorescein is introduced into a methacrylate having an acid-labile group as a repeating unit as mentioned above by copolymerization, although an adhesive property onto an inorganic substrate can be improved while suppressing the substrate reflection, implantation characteristics onto a non-planar substrate cannot be improved. In order to improve implantation characteristics, addition of a low-molecular weight substance is effective; but if molecular weight of a resin having an acid-labile group is lowered, acid diffusion may become larger whereby deteriorating a resolution. Addition of a monomer such as a phenol phthalein, a phenol red, a naphtholphthalein, and a fluorescein may lead to generation of a subliming component during the time of baking or decrease in a resolution by increase of acid diffusion during the time of FEB.

Inventors of the present invention found that, as the base resin for a positive resist composition, especially for a chemically amplified positive resist, use of a resin blend, containing a polymer containing a repeating unit which contains a structure having a hydrogen atom of a carboxyl group thereof substituted with an acid-labile group having a cyclic structure, and a novolak resin of a fluorescein, is extremely effective; and based on this finding, the present invention could be completed.

Hereinafter, the present invention will be explained in more detail.

The positive resist composition of the present invention contains, as base resins contained therein, a polymer containing a repeating unit which contains a structure having a hydrogen atom of a carboxyl group thereof substituted with an acid-labile group having a cyclic structure as the component (A) and a novolak resin of a substituted or an unsubstituted fluorescein as the component (B), and in addition, a photo acid generator.

The positive resist composition of the present invention is excellent in resolution especially on a non-planar substrate having high reflection, in implantation characteristics and adhesion, in process conformity, and in a pattern profile after light exposure; and it has a high resolution. Accordingly, the positive resist composition of the present invention has a high practical value because of these excellent properties, and thus, is very useful as a resist composition for an ion implantation process of a VLSI circuit and as a material for forming a mask pattern.

The repeating unit of the component (A) which contains a structure having a hydrogen atom of a carboxyl group thereof substituted with an acid-labile group having a cyclic structure is preferably a repeating unit "a" shown by the following general formula (1),

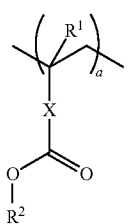
(1)

wherein $R^1$ represents a hydrogen atom or a methyl group. X represents a single bond, a naphthylene group, or a connecting group having 1 to 14 carbon atoms and containing one, or two or more groups selected from an ester group, an ether group, and a lactone ring; and $R^2$ represents an acid-labile group having the foregoing cyclic structure.

A monomer Ma to obtain the repeating unit "a", shown by the general formula (1), which has a structure substituted with an acid-labile group having a cyclic structure can be shown by the following general formula,

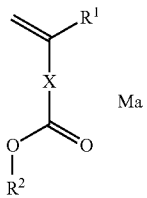
Ma wherein $R^1$, $R^2$, and X represent the same meanings as before.

In this case, illustrative example of the connecting group having 1 to 14 carbon atoms in X includes a linear, a branched, or a cyclic alkylene group; an arylene group such as a phenylene group and a naphthylene group; and an aralkylene group in which the foregoing alkylene and arylene groups are connected. Illustrative example of the connecting group having 1 to 14 carbon atoms and containing a lactone ring in X includes the following.

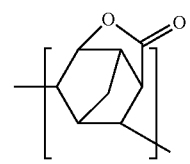

Specific example of the monomer Ma to obtain the repeating unit "a" includes the followings.

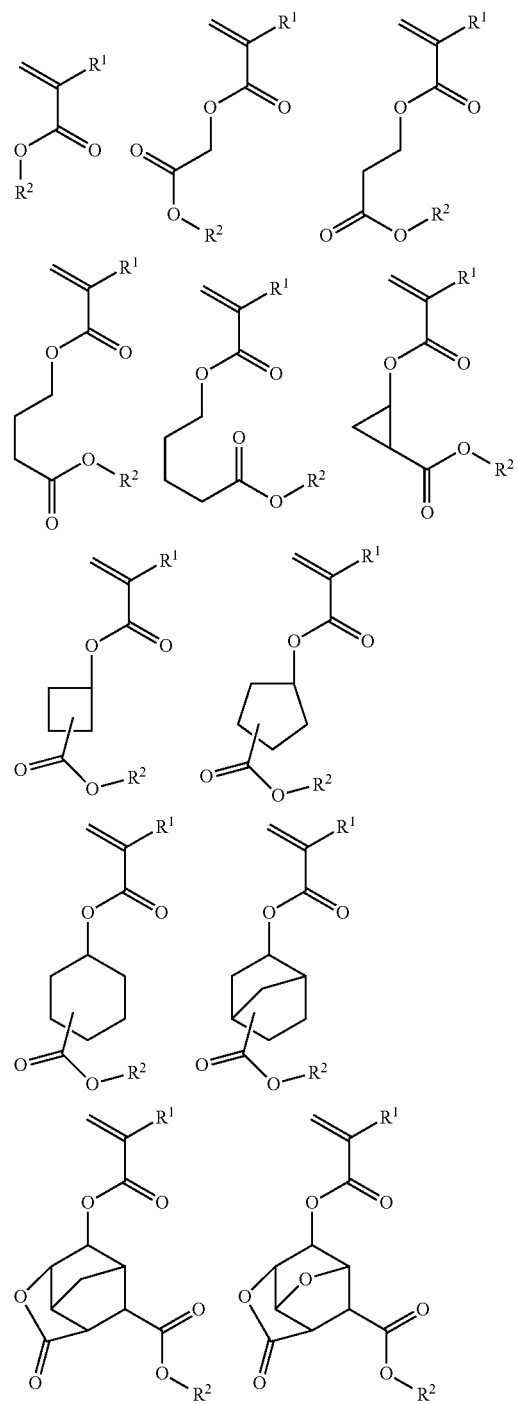

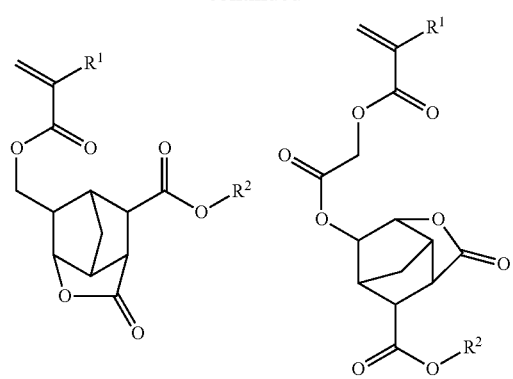
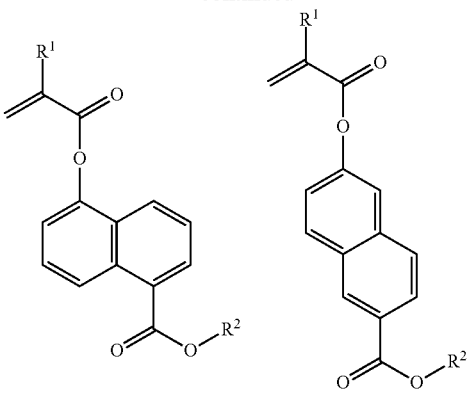
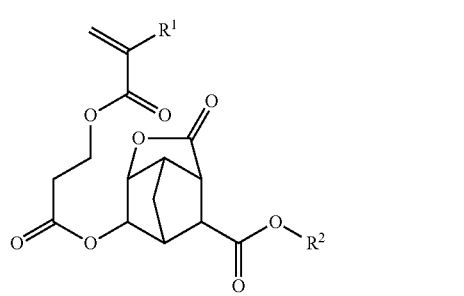
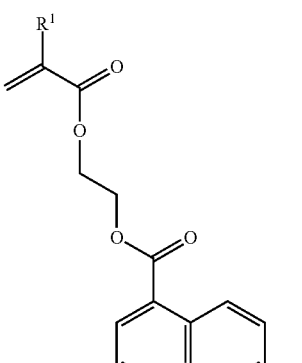
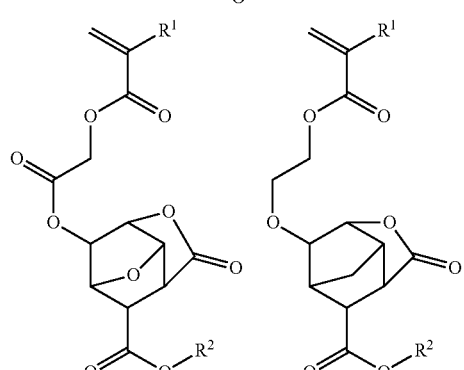
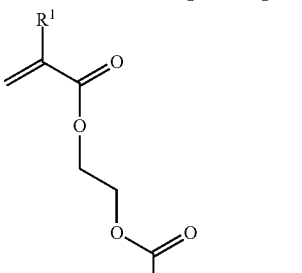
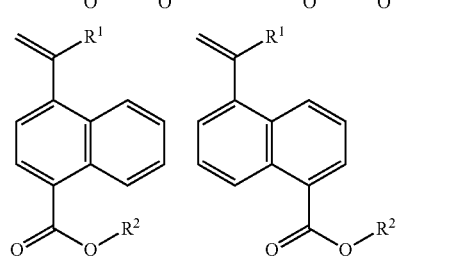
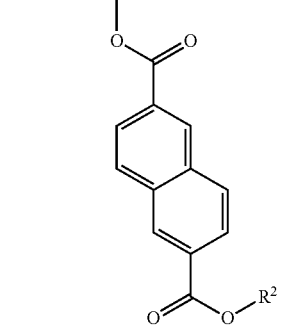
A variety of the acid-labile groups of $R^2$ in the general formula (1) may be selected, while they may be the same or different; especially those shown by the following general formula (A-1) may be selected.
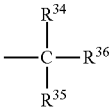
(A-1)

Wherein $R^{34}$ represents a linear, a branched, or a cyclic alkyl group having 1 to 16 carbon atoms, an aryl group having 6 to 10 carbon atoms, or an alkenyl group having 2 to 16 carbon atoms, provided that these groups may optionally contain an oxygen atom, a sulfur atom, and so on. $R^{35}$ and $R^{36}$ are bonded with each other together with a carbon atom to which these groups are bonded whereby forming a non-aromatic ring having 3 to 20 carbon atoms, especially 4 to 16 carbon atoms.

Specific example of the acid-labile group in the formula (A-1) includes the groups shown by the following formulae (A-1)-1 to (A-1)-10.

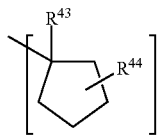
(A-1)-1

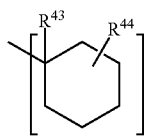
(A-1)-2

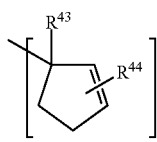
(A-1)-3

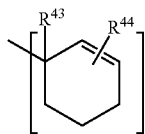
(A-1)-4

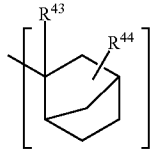
(A-1)-5

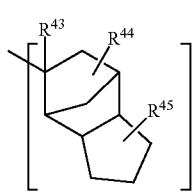
(A-1)-6

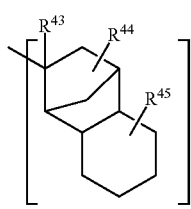
(A-1)-7

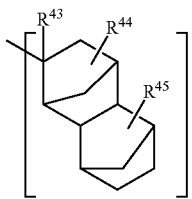
(A-1)-8

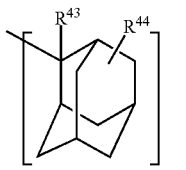
(A-1)-9

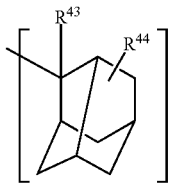
(A-1)-10

In addition, a group such as those shown by the following formulae (A-2)-1 to (A-2)-8 may also be preferably used as $R^2$.

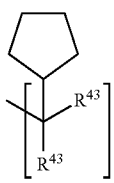
(A-2)-1

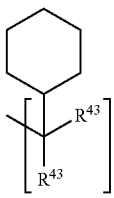
(A-2)-2

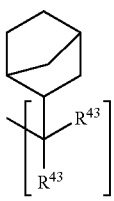
(A-2)-3

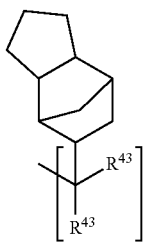
(A-2)-4

(A-2)-5
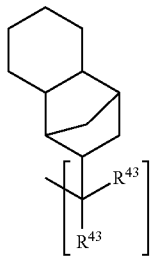

(A-2)-6
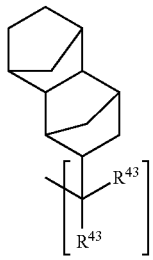

(A-2)-7
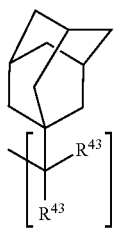

(A-2)-8
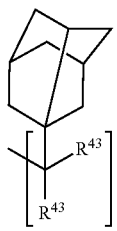

In the formulae (A-1)-1 to (A-1)-10 and (A-2)-1 to (A-2)-8, $R^{43}$ represents the same or different linear, branched, or cyclic alkyl group having 1 to 8 carbon atoms, or aryl group having 6 to 20 carbon atoms such as a phenyl group and a naphthylene group. $R^{44}$ and $R^{45}$ represent a hydrogen atom, or a linear, a branched, or a cyclic alkyl group having 1 to 20 carbon atoms.

An especially preferable repeating unit "a" shown by the general formula (1) is a repeating unit of (meth)acrylate ester having an exo structure shown by the following general formula (3),

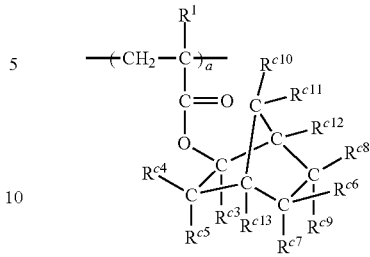
(3)

wherein $R^1$ represents the same meaning as before. $R^{c3}$ represents a linear, a branched, or a cyclic alkyl group having 1 to 8 carbon atoms, or an optionally substituted aryl group having 6 to 20 carbon atoms. Each $R^{c4}$ to $R^{c9}$, $R^{c12}$ and $R^{c13}$ independently represents a hydrogen atom, or a monovalent hydrocarbon group having 1 to 15 carbon atoms and optionally containing a heteroatom; and $R^{c10}$ and $R^{c11}$ represent a hydrogen atom, or a monovalent hydrocarbon group having 1 to 15 carbon atoms and optionally containing a heteroatom. $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$ may form a ring with each other, and in this case, the group which involves in ring formation is a divalent hydrocarbon group having 1 to 15 carbon atoms and optionally containing a heteroatom. In addition, $R^{c4}$ and $R^{c13}$, $R^{c10}$ and $R^{c13}$, or $R^{c6}$ and $R^{c8}$ may form a double bond by directly bonding with each other which are bonded to neighboring carbon atoms. Meanwhile, this formula also represents enantiomers thereof.

Meanwhile, an ester monomer to obtain a repeating unit having the exo structure shown by the above formula (3) is described in the Japanese Patent Laid-Open Publication No. 2000-327633. Specific example thereof includes the followings though not limited to them.

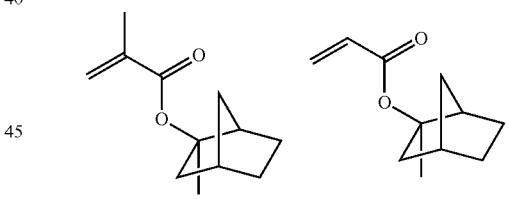

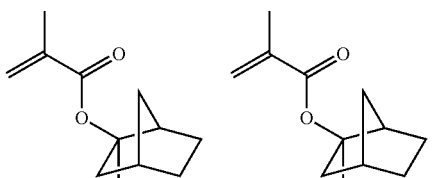

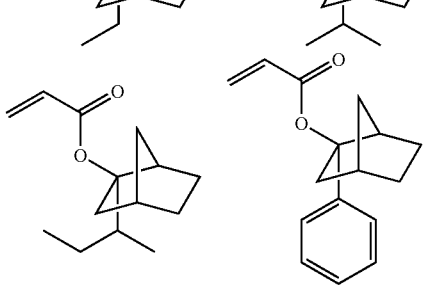

-continued

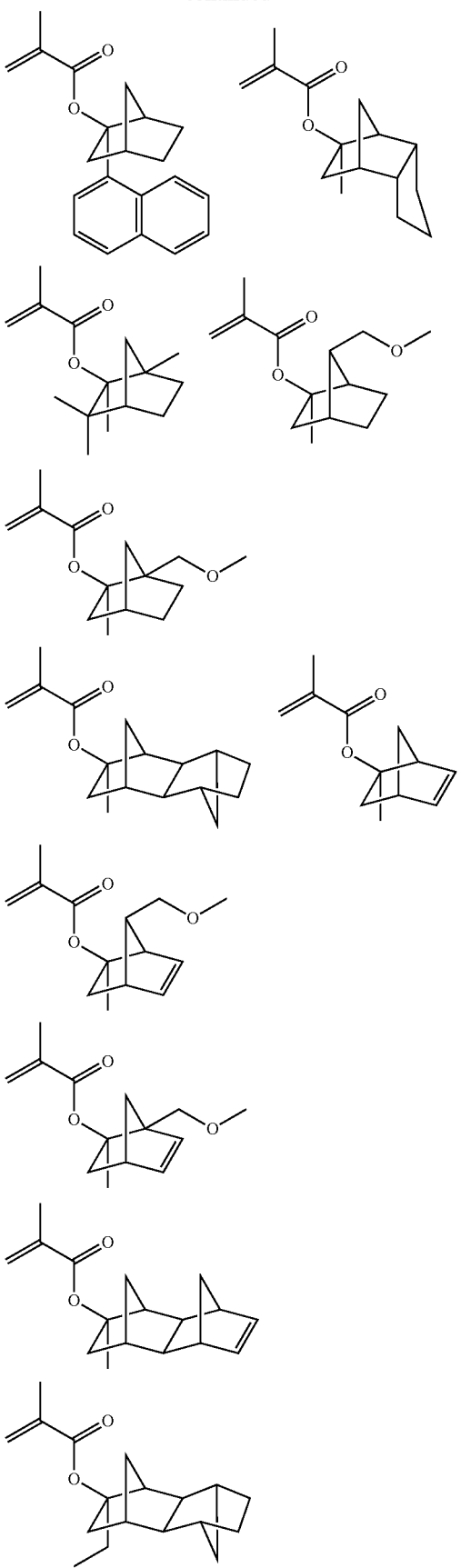

-continued

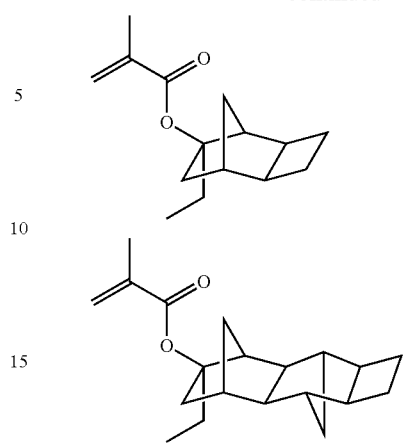

In addition, as to the repeating unit "a" having an acid-labile group, a repeating unit of a (meth)acrylate ester having a furandiyl group, a tetrahydrofurandiyl group, or an oxanorbornanediyl group, shown by the following general formula (4), may be mentioned,

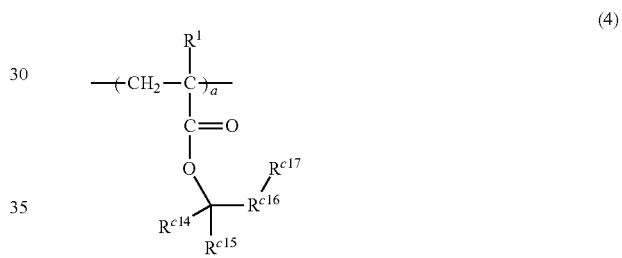

(4)

wherein $R^1$ represents the same meaning as before. Each of $R^{c14}$ and $R^{c15}$ independently represents a linear, a branched, or a cyclic monovalent hydrocarbon group having 1 to 10 carbon atoms. $R^{c14}$ and $R^{c15}$ may be bonded with each other to form an aliphatic hydrocarbon ring together with a carbon atom to which these groups are bonded. $R^{c16}$ represents a divalent group selected from a furandiyl group, a tetrahydrofurandiyl group, or an oxanorbornanediyl group. $R^{c17}$ represents a hydrogen atom, or a linear, a branched, or a cyclic monovalent hydrocarbon group having 1 to 10 carbon atoms and optionally containing a hetero atom.

Illustrative example of the monomer to obtain a repeating unit which is substituted with an acid-labile group having a furandiyl group, a tetrahydrofurandiyl group, or an oxanorbornanediyl group includes the followings. Here, Ac means an acetyl group and Me means a methyl group.

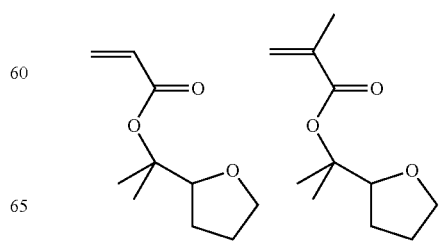

-continued
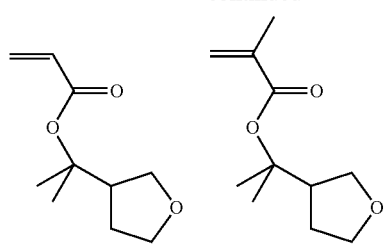
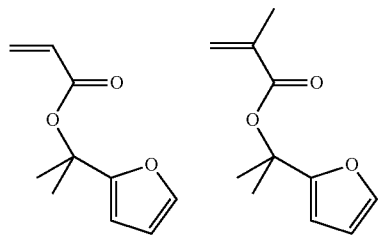
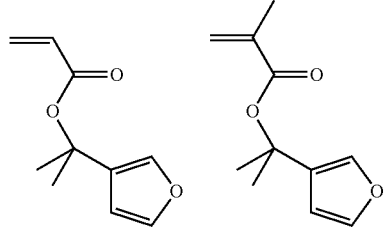
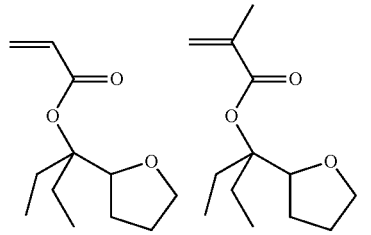
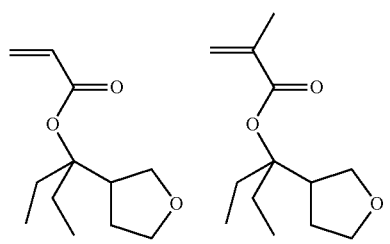
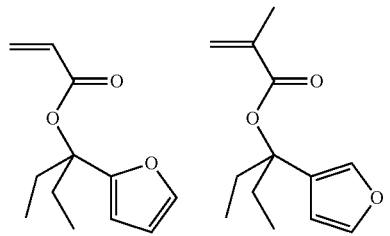
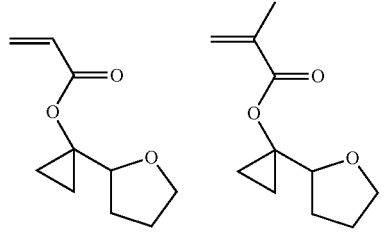
-continued
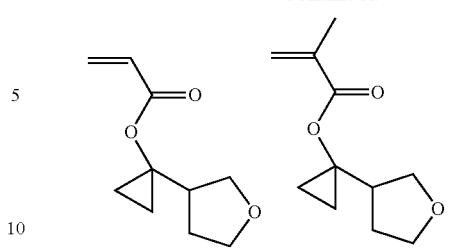
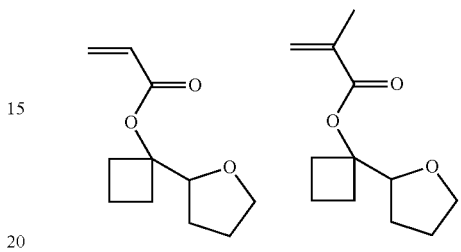
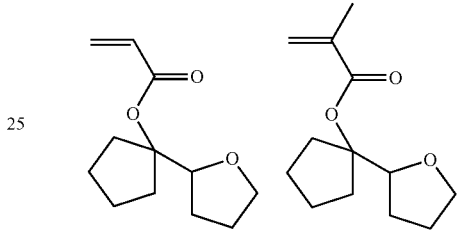
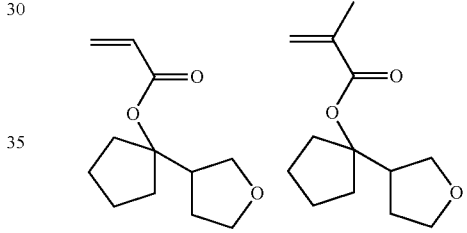
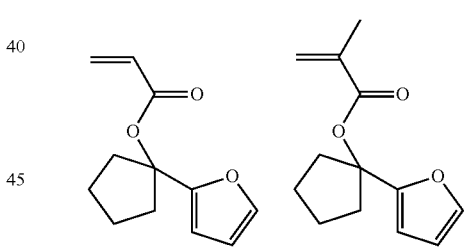
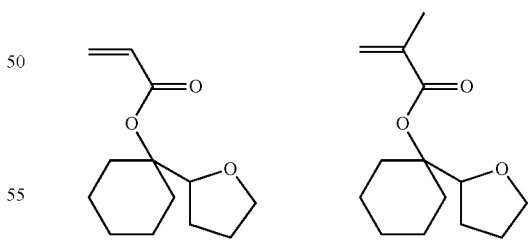
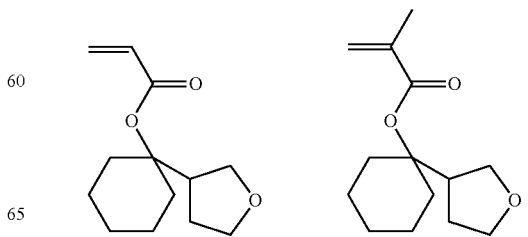

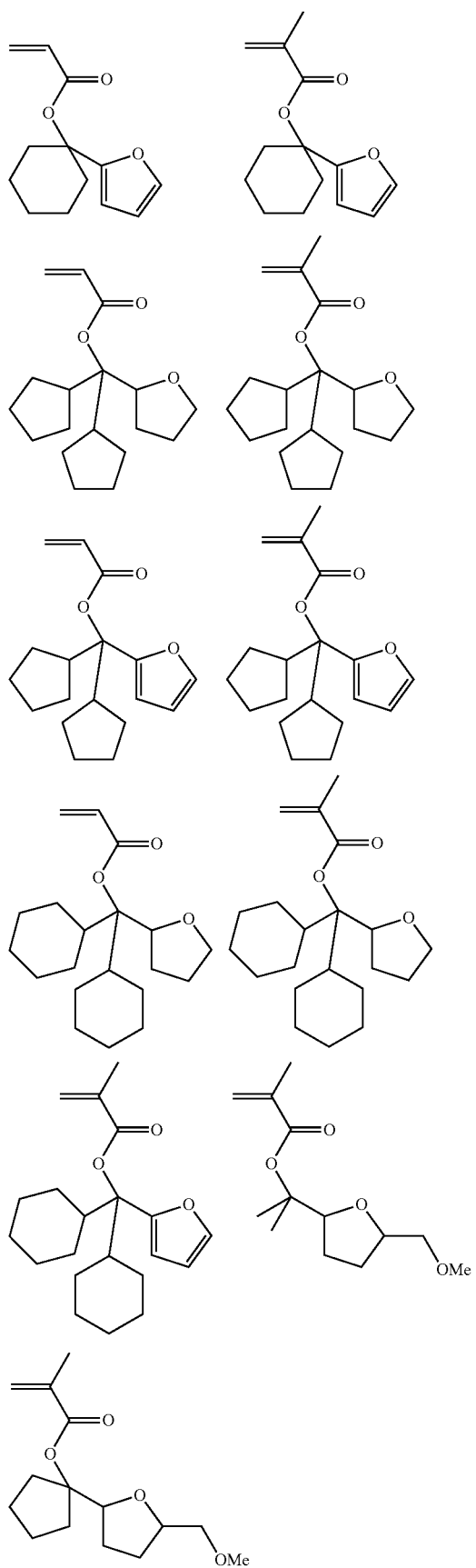
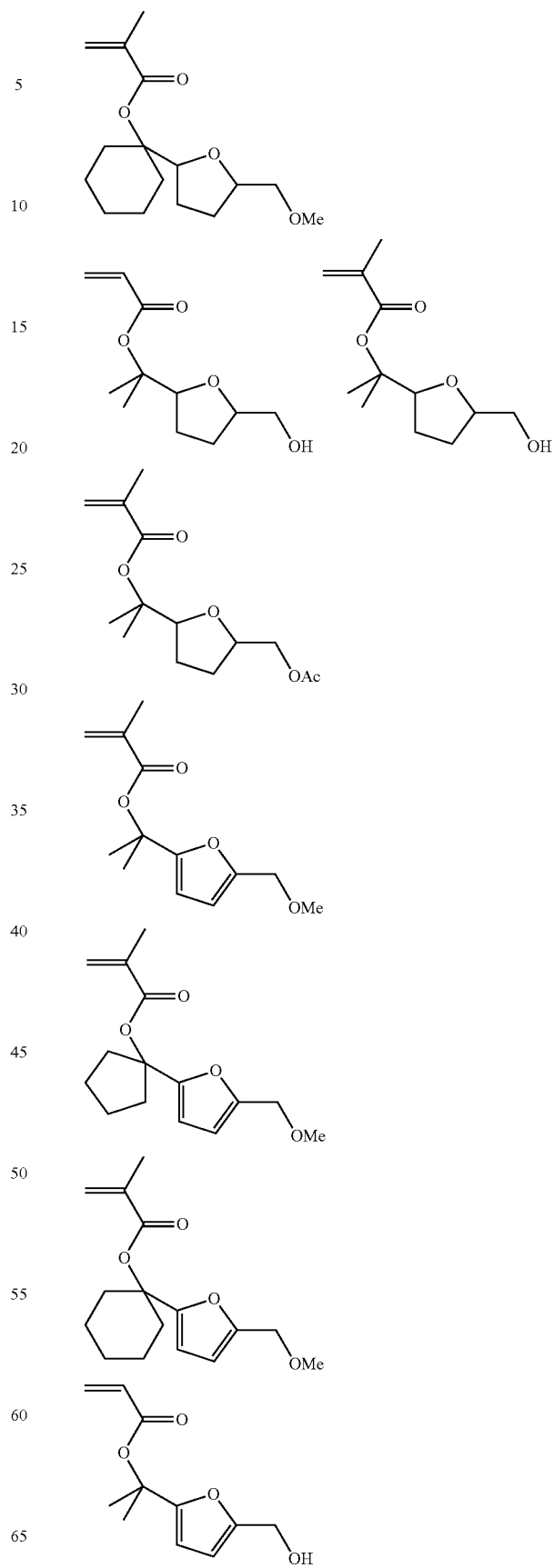

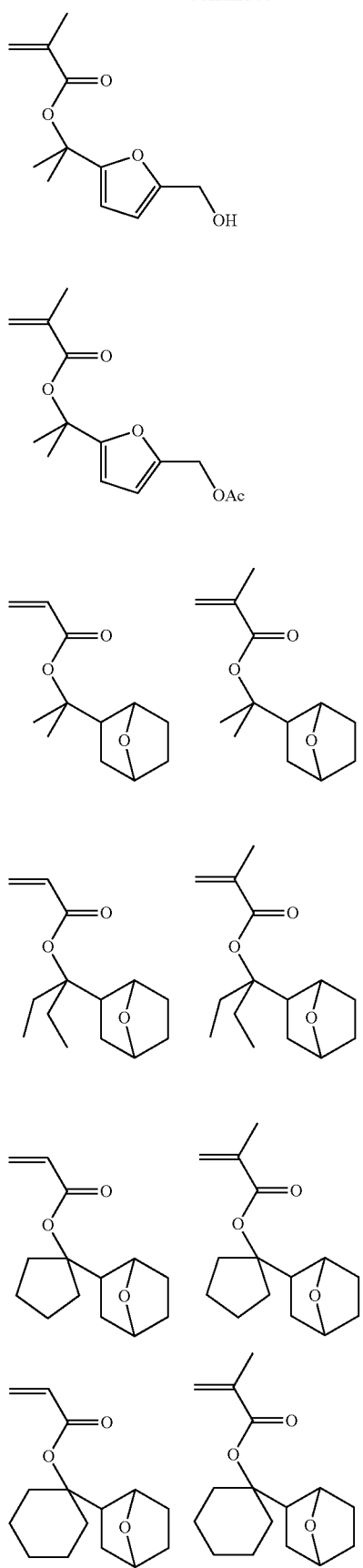
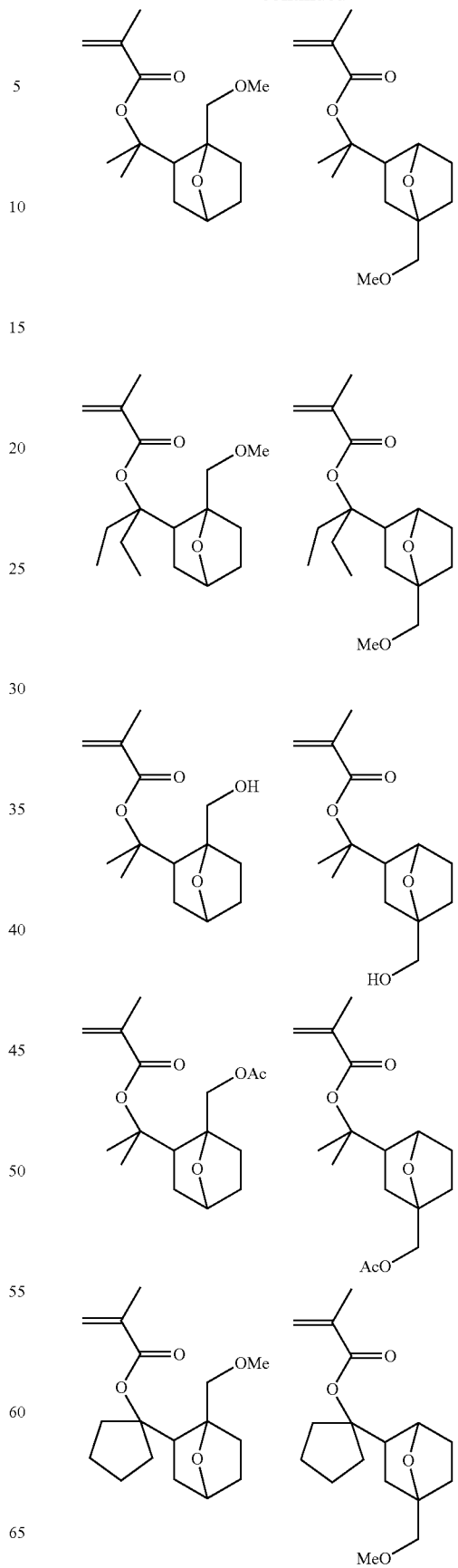

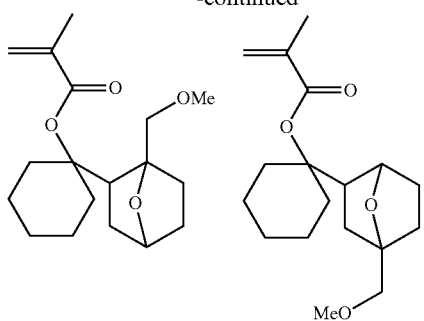

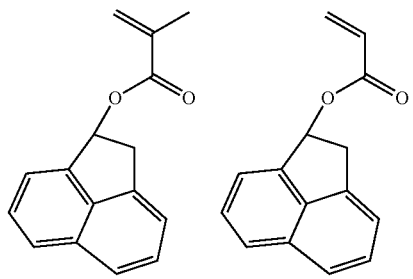

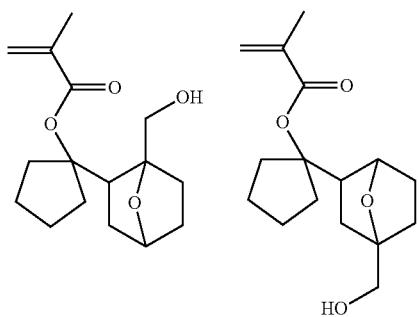

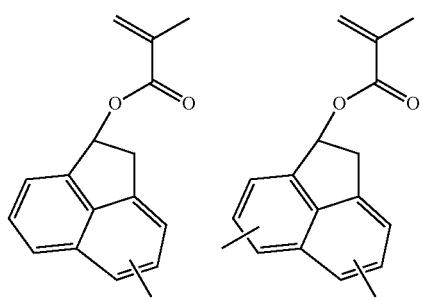

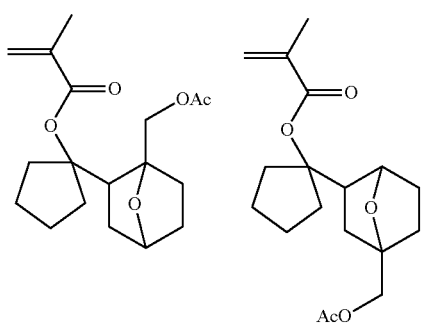

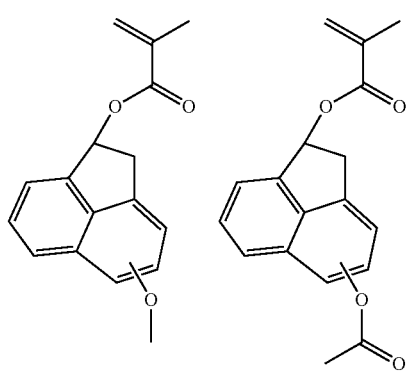

In addition, an acid-labile group shown by the following general formula (A-3) may also be mentioned as the acid-labile group having a ring structure of $R^2$ in the general formula (1),

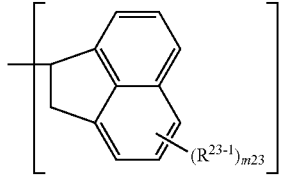

(A-3)

wherein $R^{23-1}$ represents a hydrogen atom, or an alkyl group having 1 to 4 carbon atoms, an alkoxy group, an alkanoyl group, or an alkoxycarbonyl group. m23 represents an integer of 1 to 4.

Specific example of the monomer having a carboxyl group which is substituted with an acid-labile group shown by the formula (A-3) includes the followings.

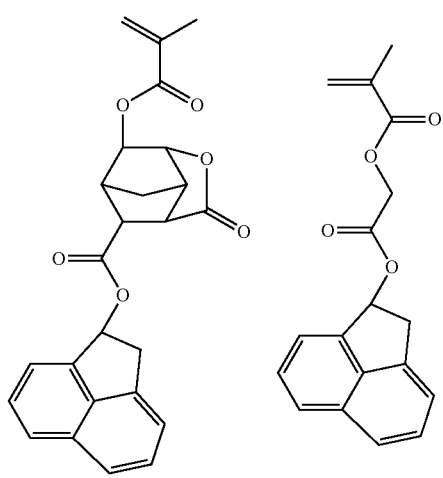

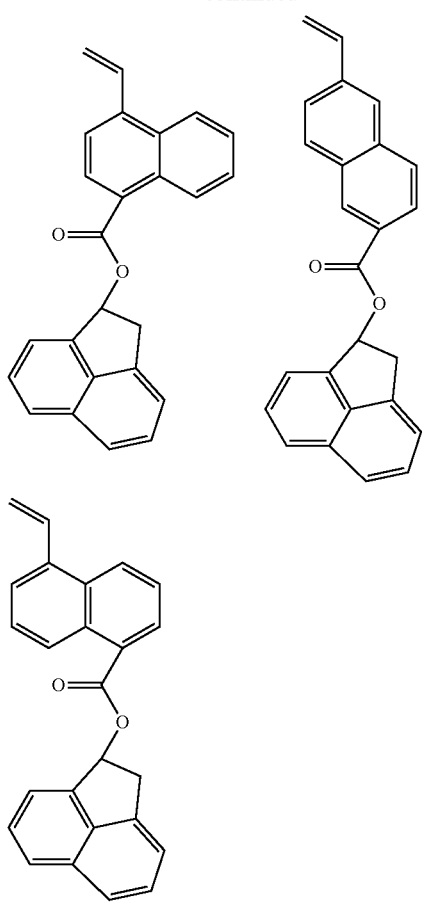

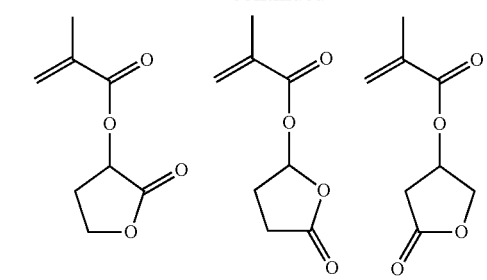

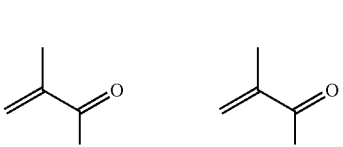

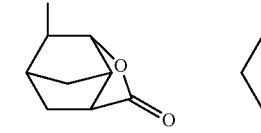

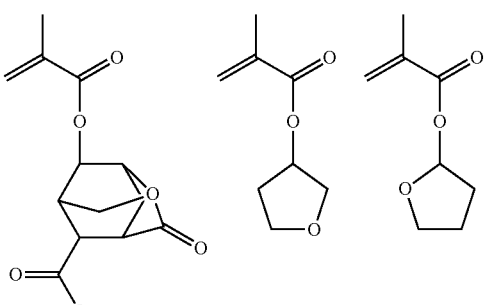

In addition, in the present invention, the component (A) used as the base resin is preferably a polymer which contains, in addition to the repeating unit "a" shown by the general formula (1), a repeating unit "b" which has an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, and an amide group (molar ratio of the repeating unit "a" and molar ratio of the repeating unit "b", relative to entirety of the repeating units contained in the polymer, are in the ranges of $0<a<1.0$, $0<b<1.0$, and $0.2 \leq a+b \leq 1.0$.)

Specific example of the monomer to obtain the repeating unit "b" having an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, and an amide group includes the followings.

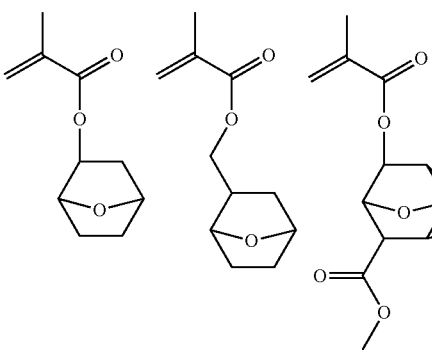

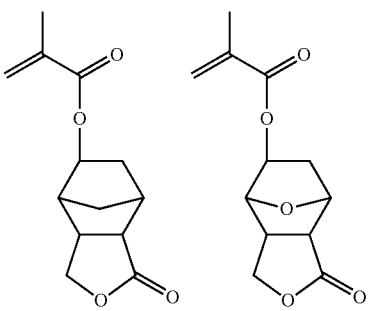

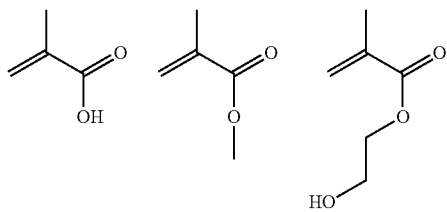

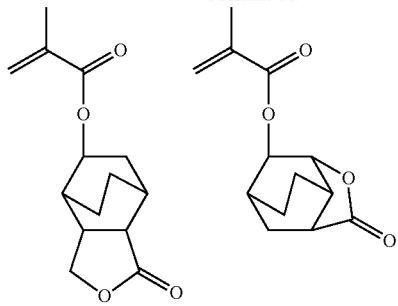
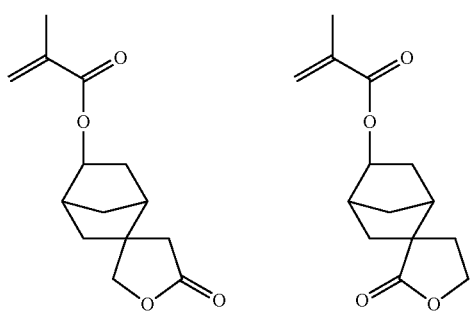
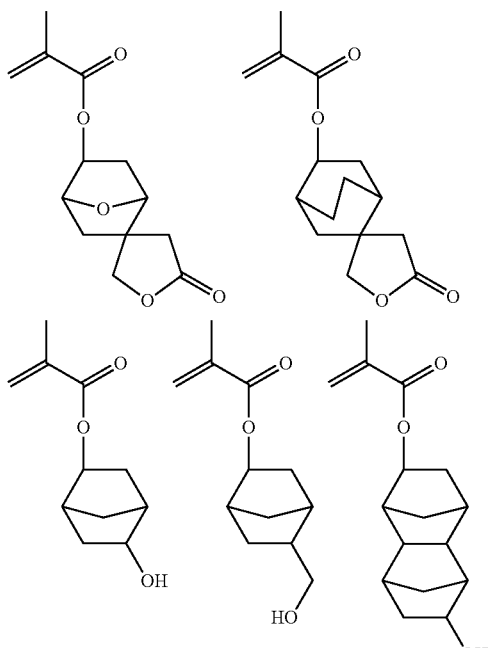
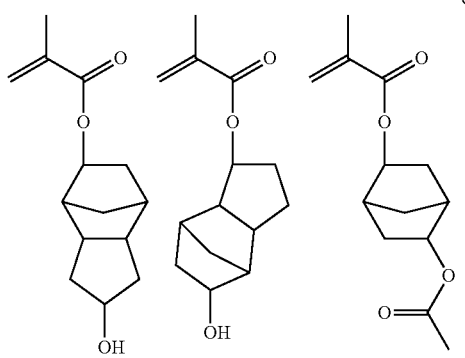
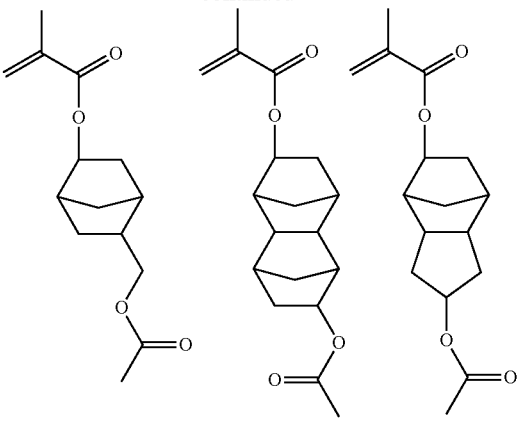
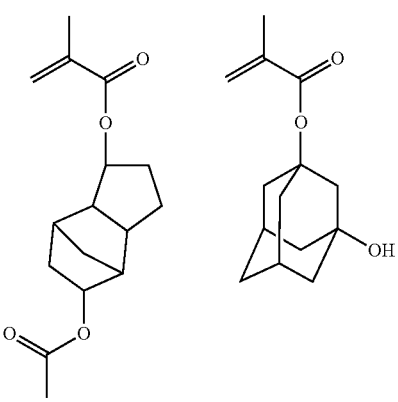
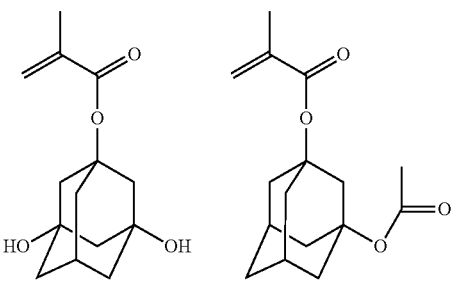
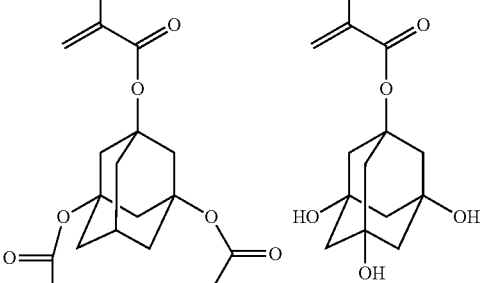
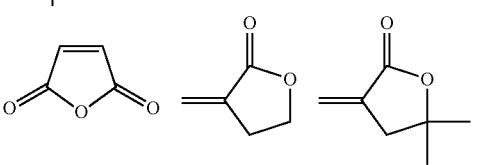

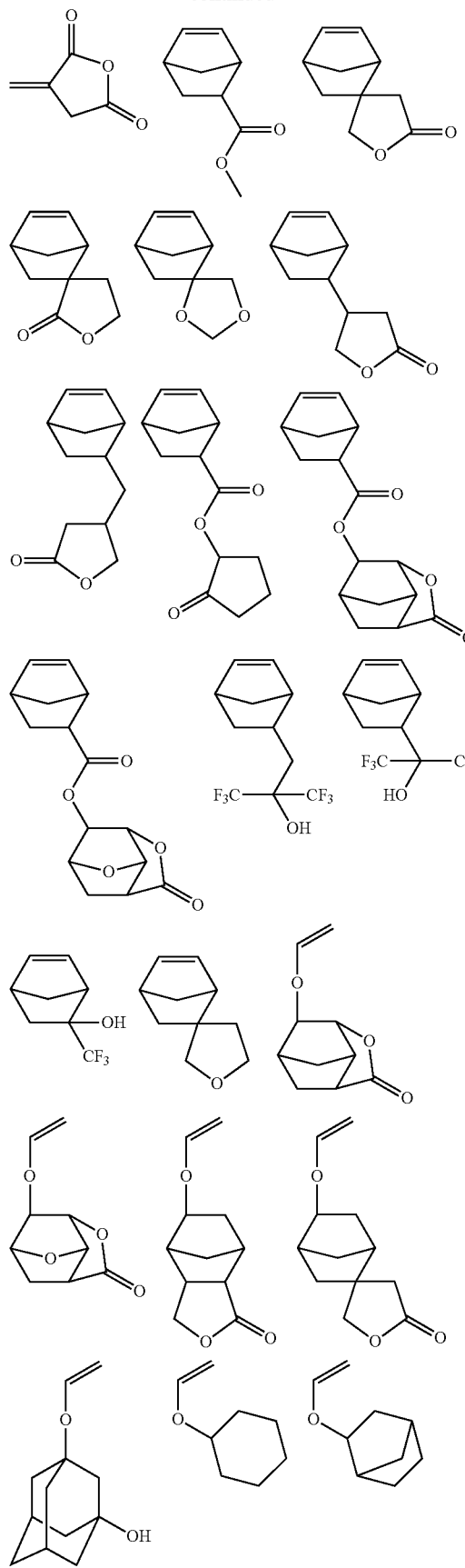
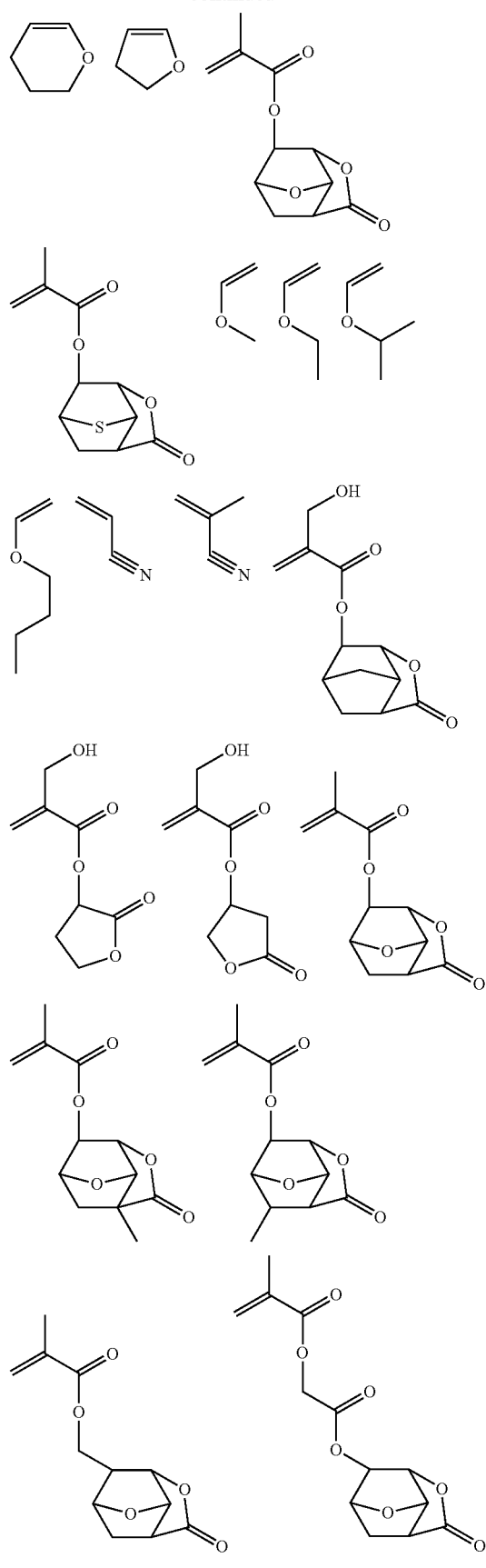

31
-continued
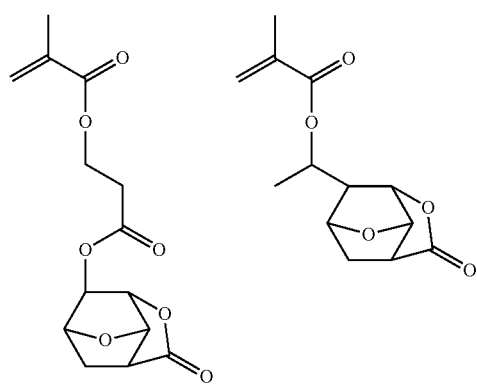
32
-continued
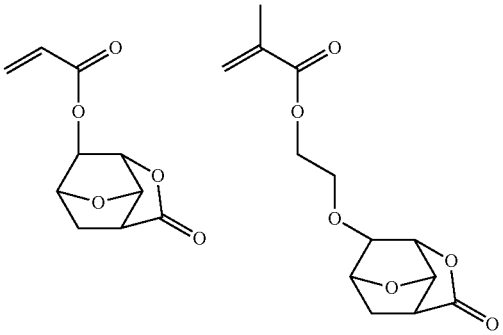
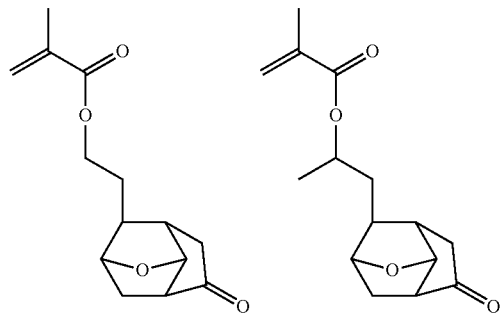
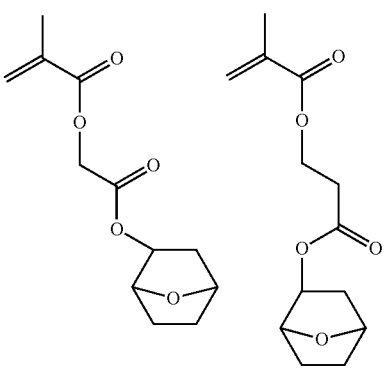
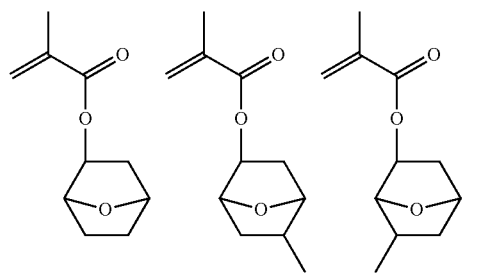
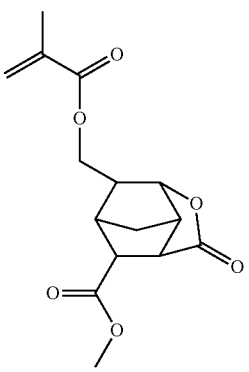
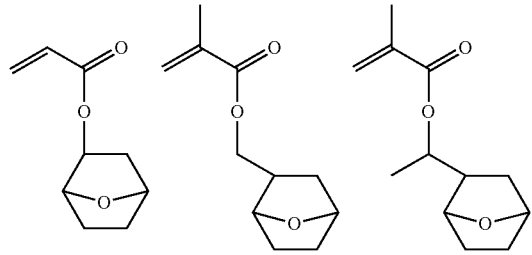
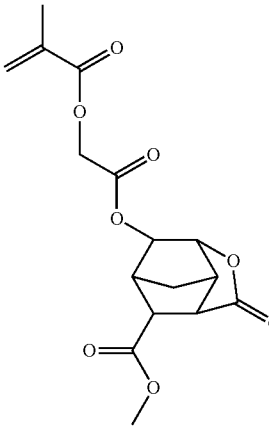
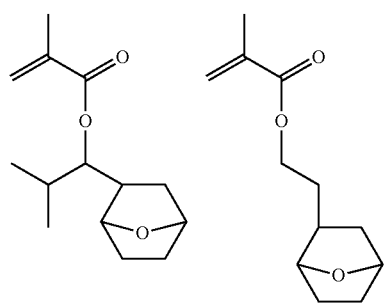

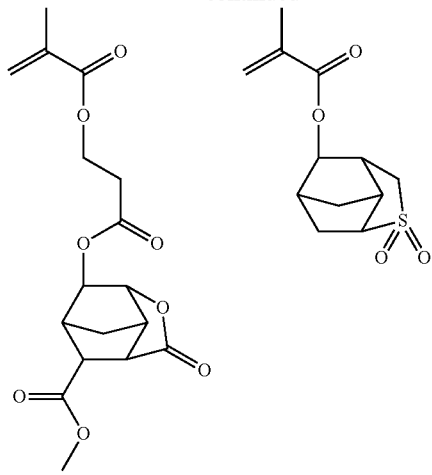
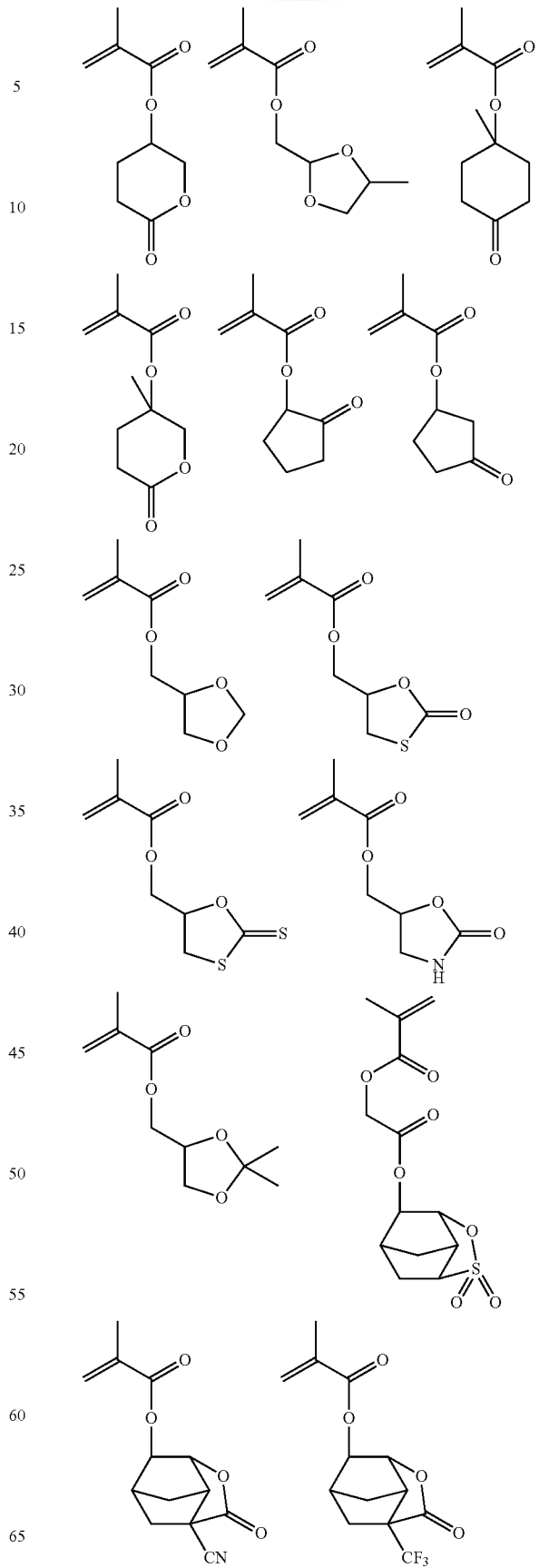

35
-continued
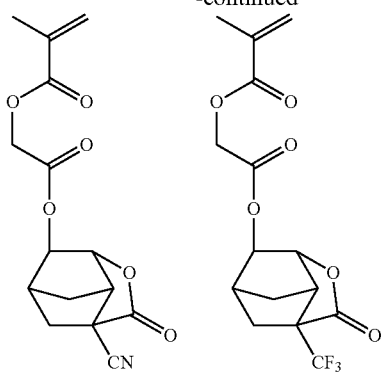
36
-continued
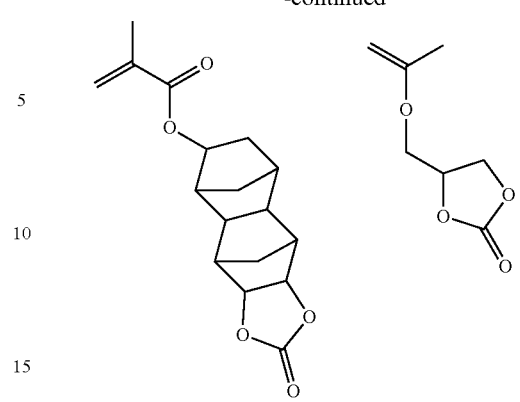
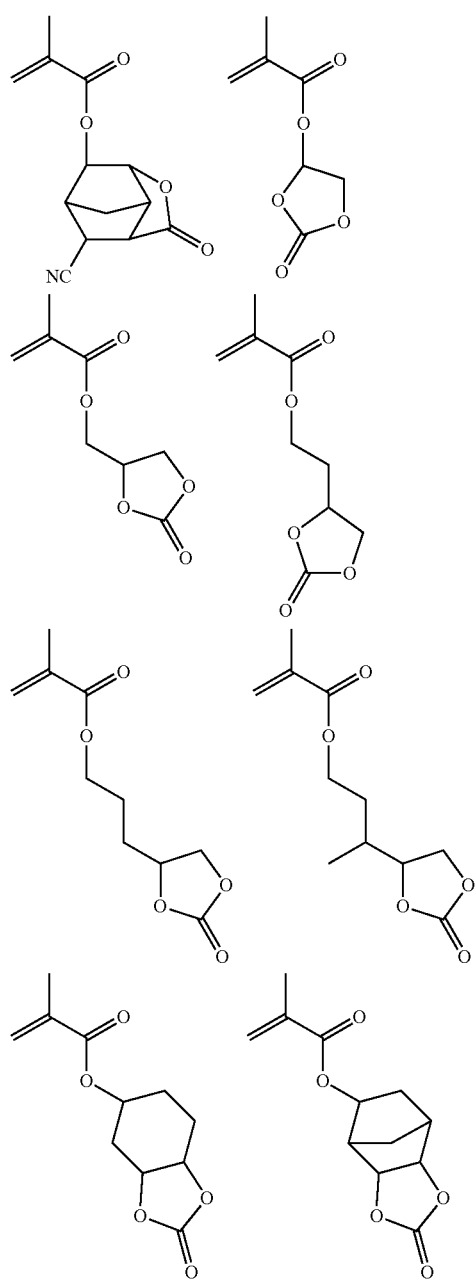
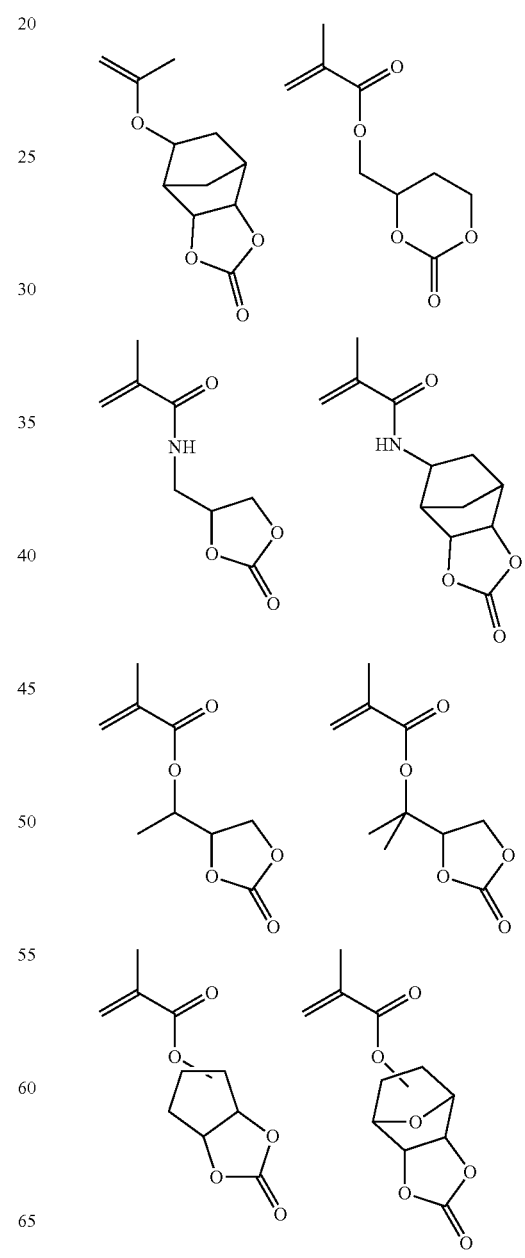

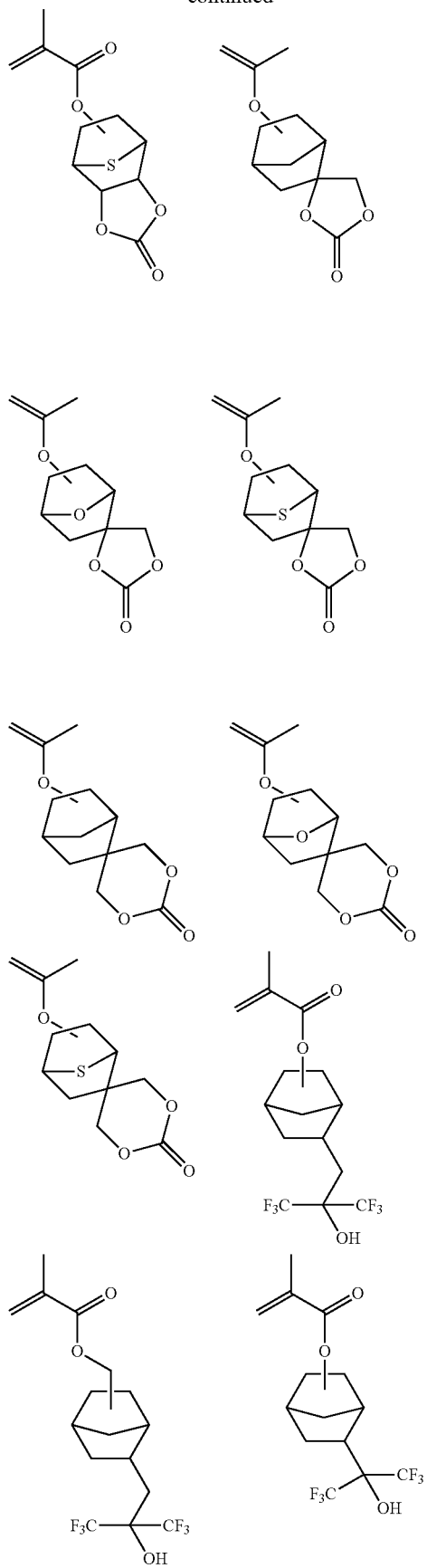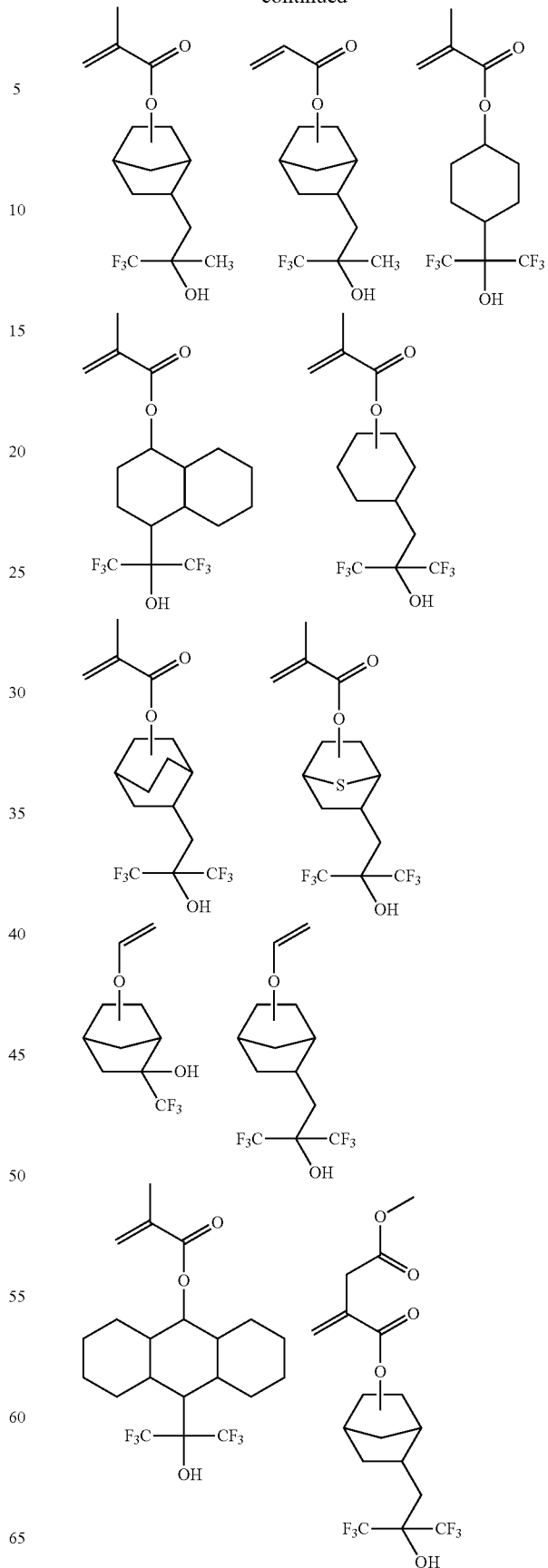

-continued
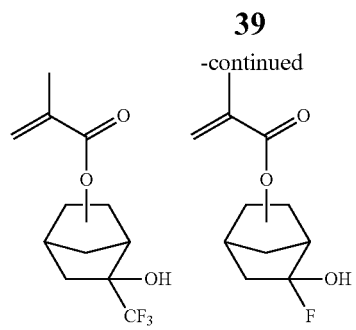
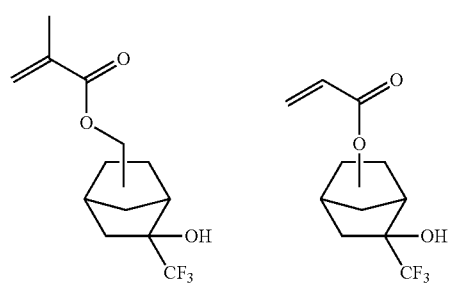
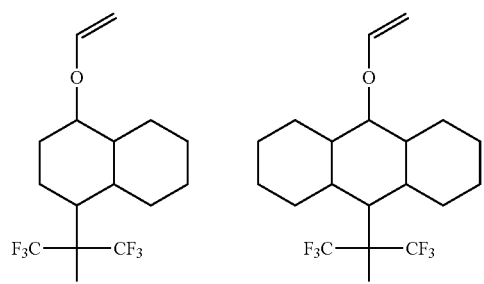
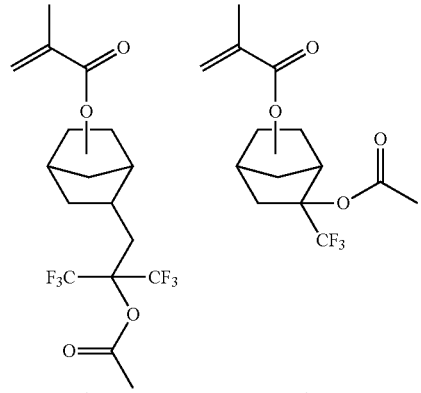
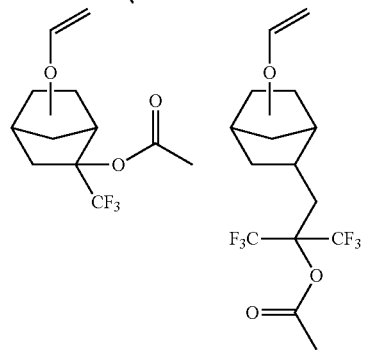
-continued
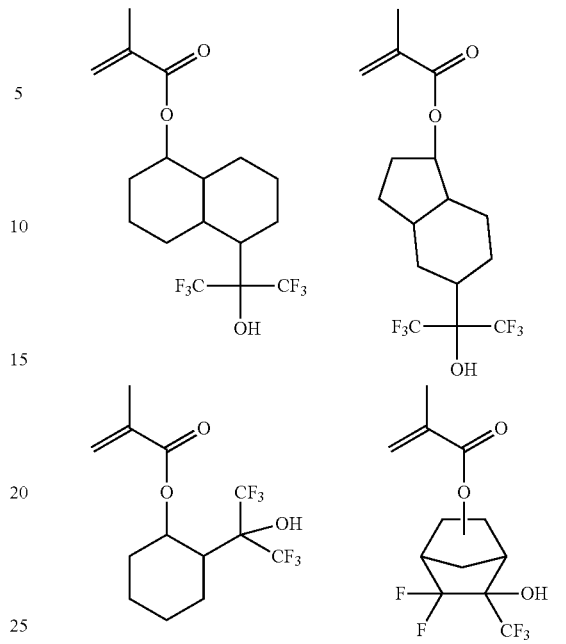
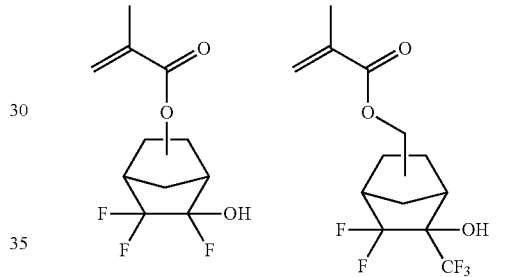
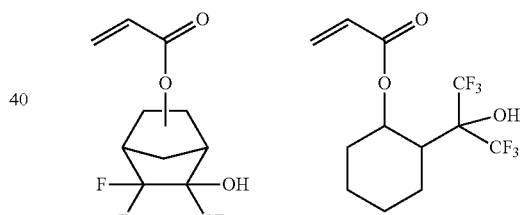
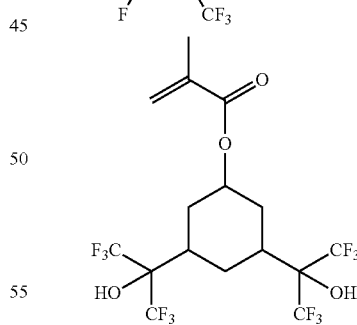
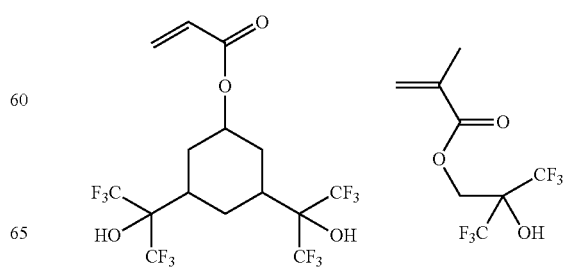

41
-continued
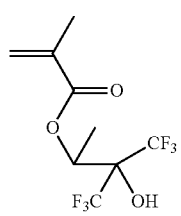 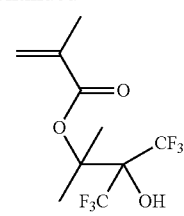
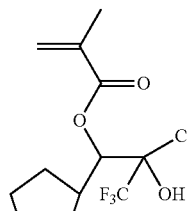 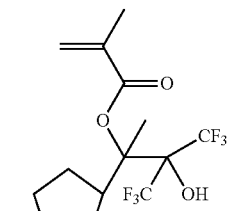
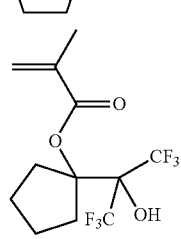 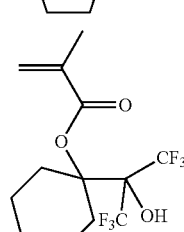
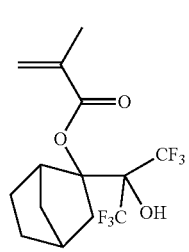 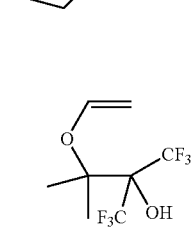
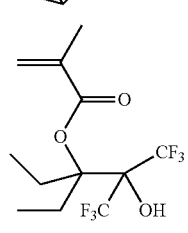 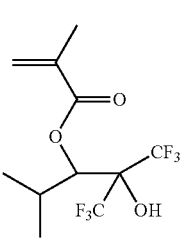
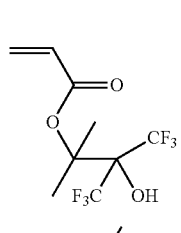 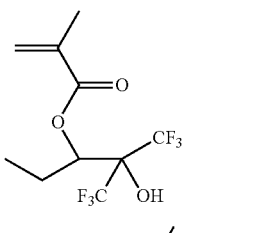
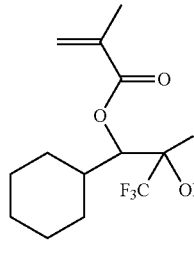 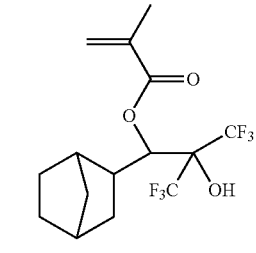
42
-continued
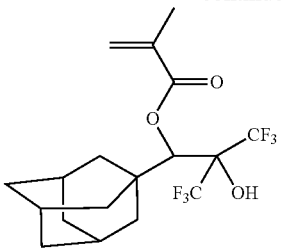 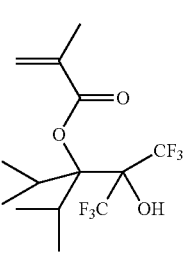
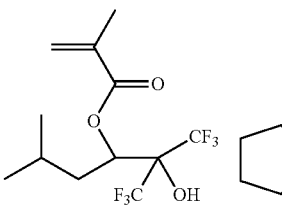 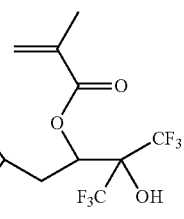
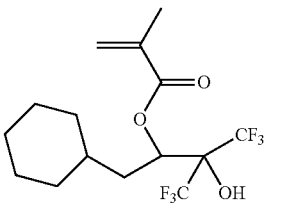 
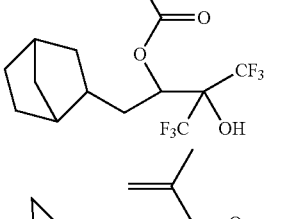 
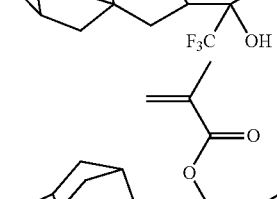 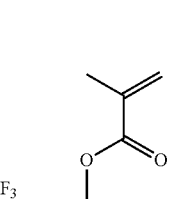
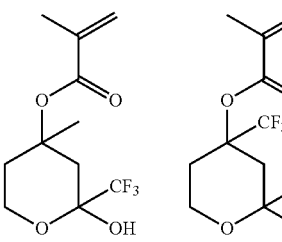 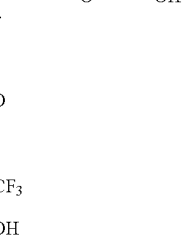

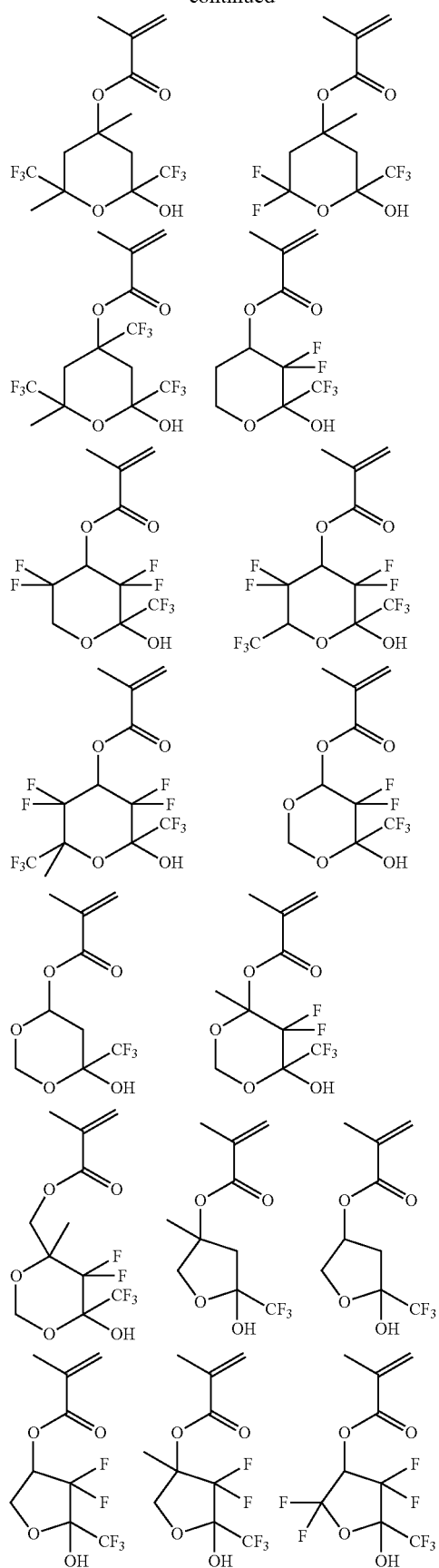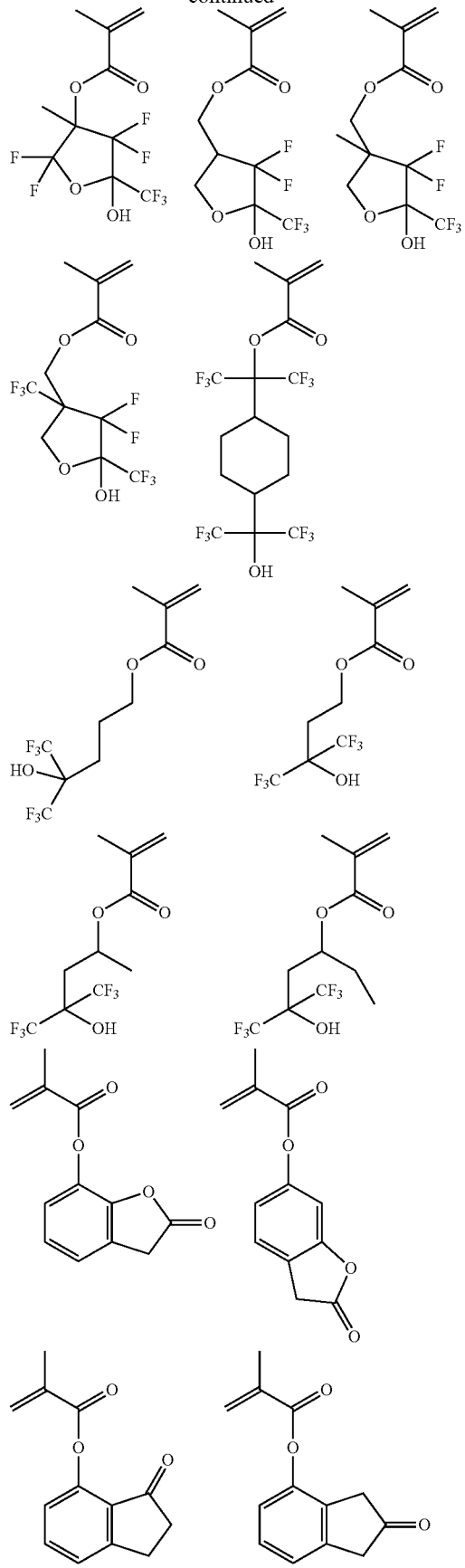

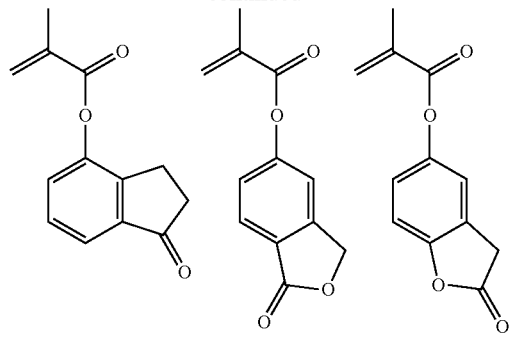
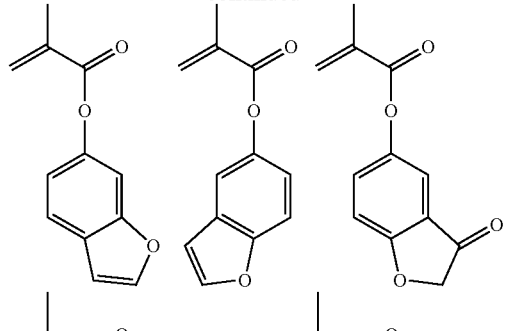
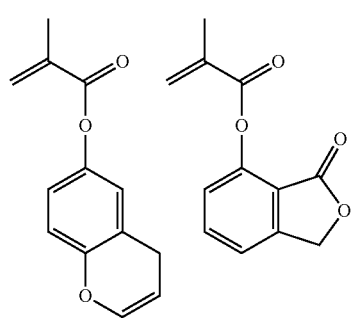
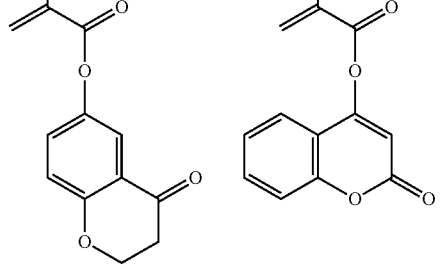
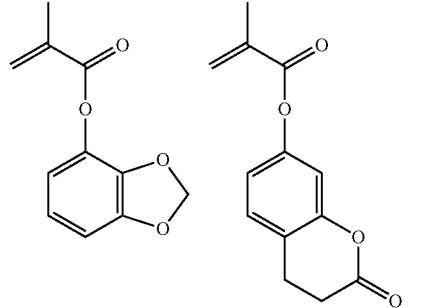
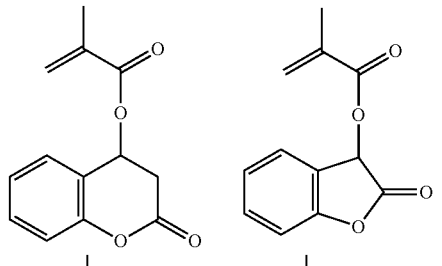
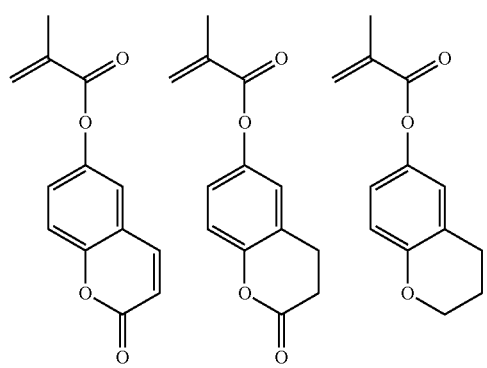
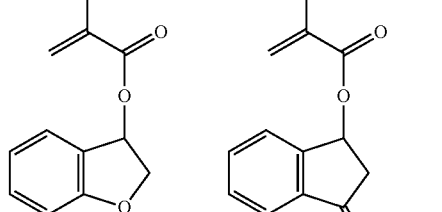
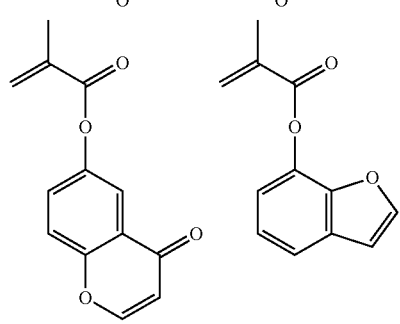
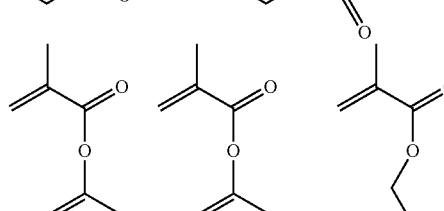
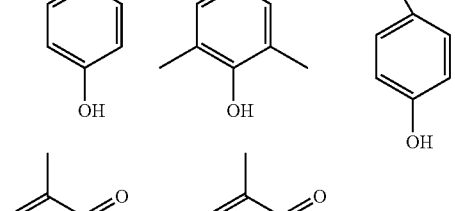
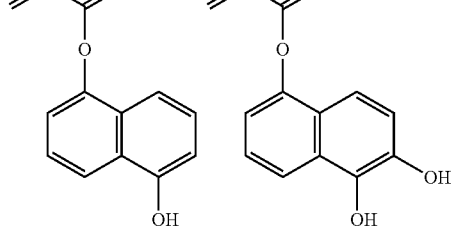

47
-continued
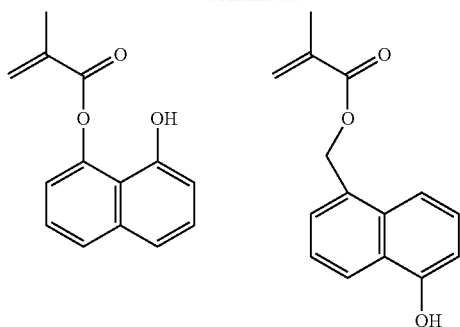
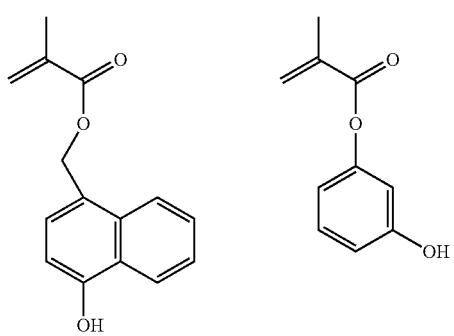
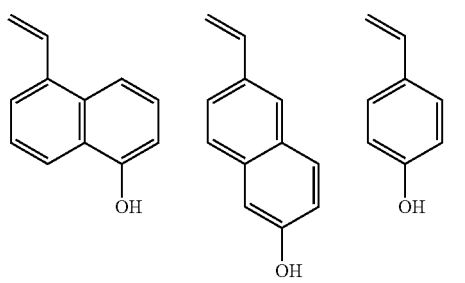
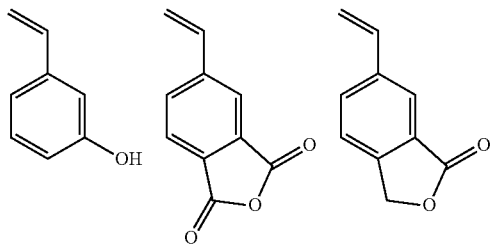
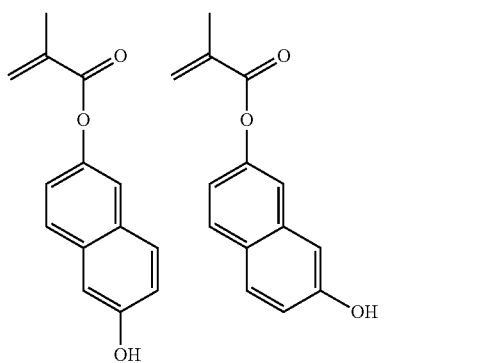
48
-continued
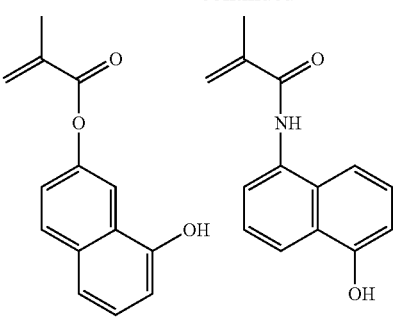
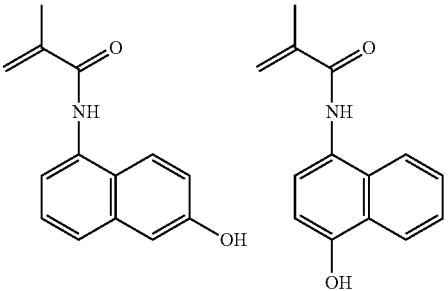
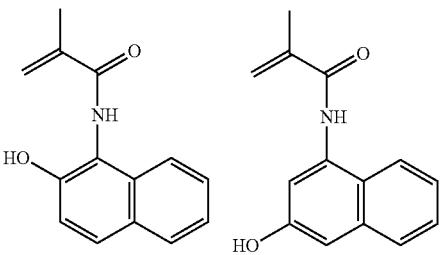
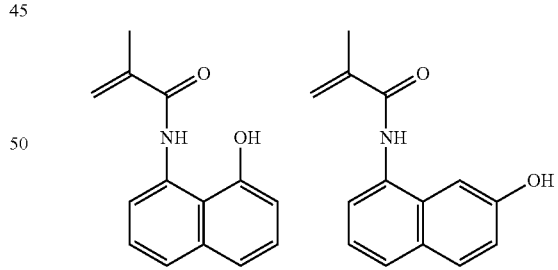
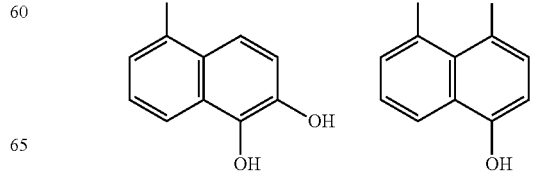

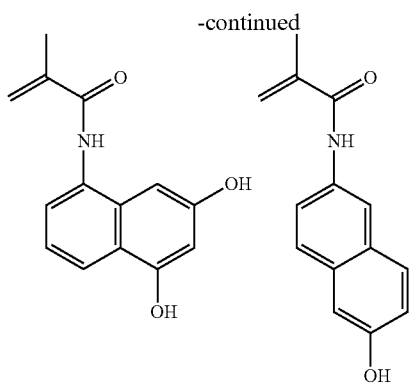

In the case of a monomer having a hydroxyl group, the hydroxyl group may be substituted during polymerization with an acetal group such as an ethoxyethoxy group, which is readily de-protected by an acid, and then de-protected by a weak acid and water after polymerization, or the hydroxyl group may be substituted with an acetyl group, a formyl group, a pivaloyl group, or the like and then hydrolyzed by a base.

In the present invention, a polymer in the component (A) may be copolymerized with a repeating unit other than the repeating unit "a" shown by the general formula (1) and the repeating unit "b" having an adhesion group; and thus, a repeating unit "c" of sulfonium salts c1, c2, and c3 shown by the following general formula (5) may be copolymerized. In the Japanese Patent Laid-Open Publication Nos. H04-230645, 2005-84365, and 2006-045311, a sulfonium salt and an iodonium salt having a polymerizable olefin which can generate a specific sulfonic acid are proposed. In the Japanese Patent Laid-Open Publication No. 2006-178317, a sulfonium salt having a sulfonic acid thereof directly bonded to a main chain is proposed.

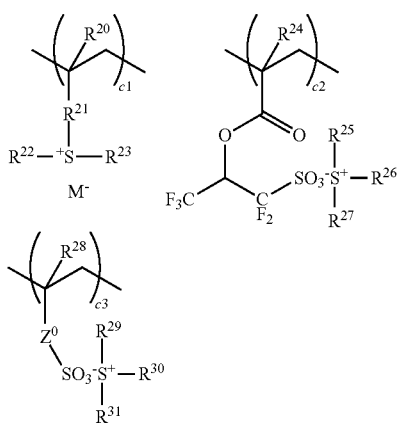

(5)

wherein $R^{20}$, $R^{24}$, and $R^{28}$ represent a hydrogen atom or a methyl group, and $R^{21}$ represents a single bond, a phenylene group, —O—R—, or —C(=O)—Y—R—. Y represents an oxygen atom or NH, and R represents a linear, a branched, or a cyclic alkylene group having 1 to 6 carbon atoms, an alkenylene group, or a phenylene group, provided that these groups may optionally contain a carbonyl group (—CO—), an ester group (—COO—), an ether group (—O—), or a hydroxyl group. $R^{22}$, $R^{23}$, $R^{25}$, $R^{26}$, $R^{27}$, $R^{29}$, $R^{30}$, and $R^{31}$ represent the same or different linear, branched, or cyclic alkyl group having 1 to 12 carbon atoms and optionally containing a carbonyl group, an ester group, or an ether group, or an aryl group having 6 to 12 carbon atoms, or an aralkyl group having 7 to 20 carbon atoms, or a thiophenyl group. $Z^0$ represents a single bond, a methylene group, an ethylene group, a phenylene group, a fluorinated phenylene group, —O—$R^{32}$—, or —C(=O)—$Z^1$—$R^{32}$—. $Z^1$ represents an oxygen atom or NH, and $R^{32}$ represents a linear, a branched, or a cyclic alkylene group having 1 to 6 carbon atoms, an alkenylene group, or a phenylene group, provided that these groups may optionally contain a carbonyl group, an ester group, an ether group, or a hydroxyl group. $M^-$ represents a non-nucleophilic counter ion. Here, $0 \leq c1 \leq 0.5$, $0 \leq c2 \leq 0.5$, $0 \leq c3 \leq 0.5$, and $0 \leq c1+c2+c3 \leq 0.5$.

By bonding the acid generator to a polymer main chain as mentioned above, an acid diffusion can be made smaller, so that it may be possible to avoid blurring of the acid diffusion which leads to deterioration of a resolution. In addition, the acid generator disperses uniformly so that edge roughness (LER and LWR) may be ameliorated.

Illustrative example of the non-nucleophilic counter ion $M^-$ includes a halide ion such as a chloride ion and a bromide ion; a fluoroalkyl sulfonate such as triflate, 1,1,1-trifluoroethanesulfonate, and nonafluorobutanesulfonate; an aryl sulfonate such as tosylate, benzenesulfonate, 4-fluorobenzenesulfonate, and 1,2,3,4,5-pentafluorobenzenesulfonate; an alkyl sulfonate such as mesylate and butanesulfonate; an imidic acid such as bis(trifluoromethylsulfonyl)imide, bis(perfluoroethylsulfonyl)imide, and bis(perfluorobutylsulfonyl)imide; and a methide acid such as tris(trifluoromethylsulfonyl)methide and tris(perfluoroethylsulfonyl)methide.

As to the non-nucleophilic counter ion $M^-$, a sulfonate whose α-position is fluoro-substituted, shown by the following general formula (K-1), and a sulfonate whose α-position and β-position are fluoro-substituted, shown by the following general formula (K-2), may also be mentioned.

$$R^{102}-F_2C-SO_3^- \quad (K\text{-}1)$$

$$\begin{array}{c} R^{103}-O \\ \phantom{R^{103}-}\diagdown \\ \phantom{R^{103}-O}F_2C-SO_3^- \\ \phantom{R^{103}-}\diagup \\ F_3C \end{array} \quad (K\text{-}2)$$

In the general formula (K-1), $R^{102}$ represents a hydrogen atom, or a linear, a branched, or a cyclic alkyl group having 1 to 20 carbon atoms, an alkenyl group having 2 to 20 carbon atoms, or an aryl group having 6 to 20 carbon atoms, provided that these groups may optionally contain an ether group, an ester group, a carbonyl group, a lactone ring, or a fluorine atom.

In the general formula (K-2), $R^{103}$ represents a hydrogen atom, or a linear, a branched, or a cyclic alkyl group having 1 to 30 carbon atoms, an acyl group, an alkenyl group having 2 to 20 carbon atoms, an aryl group having 6 to 20 carbon atoms, or an aryloxy group, provided that these groups may optionally contain an ether group, an ester group, a carbonyl group, or a lactone ring.

In addition, a repeating unit "d" such as an indene d1, an acenaphthylene d2, a chromone d3, a cumarin d4, and a norbornadiene d5, as shown in the following general formula (6) may be copolymerized, (6)

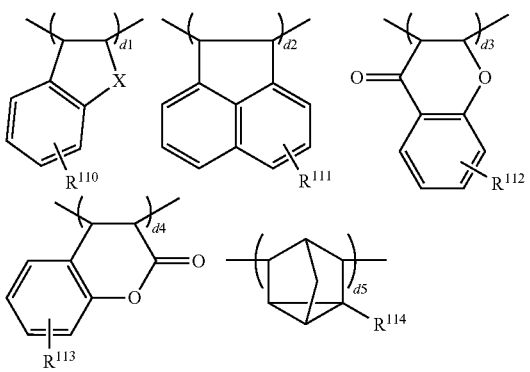

wherein $R^{110}$ to $R^{114}$ represent a hydrogen atom, an alkyl group having 1 to 30 carbon atoms, an alkyl group substituted partly or entirely with a halogen atom, a hydroxyl group, an alkoxy group, an alkanoyl group, an alkoxycarbonyl group, an aryl group having 6 to 10 carbon atoms, a halogen atom, or a 1,1,1,3,3,3-hexafluoro-2-propanol group. X represents a methylene group, an oxygen atom, or a sulfur atom; and $0 \le d1 \le 0.4$, $0 \le d2 \le 0.4$, $0 \le d3 \le 0.4$, $0 \le d4 \le 0.4$, $0 \le d5 \le 0.4$, and $0 \le d1+d2+d3+d4+d5 \le 0.5$.

Illustrative example of a repeating unit "e", which can be copolymerized thereto, other than the foregoing repeating units "a", "b", "c", and "d" includes those derived from a styrene, a vinyl naphthalene, a vinyl anthrathene, a vinyl pyrene, a methylene indane, and so on.

In one method to synthesize a polymer of the component (A), intended monomers among the monomers to give repeating units "a" to "e" are polymerized thermally in the presence of a radical polymerization initiator in an organic solvent to obtain a copolymer, which is the polymer of the component (A).

Illustrative example of the organic solvent used at the time of the polymerization includes toluene, benzene, tetrahydrofurane, diethyl ether, dioxane, cyclohexane, cyclopentane, methyl ethyl ketone, and γ-butyrolactone. Illustrative example of the polymerization initiator includes 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide, wherein the polymerization may be carried out by heating, preferably at 50 to 80° C. The reaction time thereof is 2 to 100 hours, or preferably 5 to 20 hours.

Alternatively, in the case of copolymerizing a hydroxy styrene or a hydroxy vinyl naphthalene, an acetoxy styrene or an acetoxy vinyl naphthalene is used in place of a hydroxy styrene or a hydroxy vinyl naphthalene; and after polymerization, the forgoing acetoxy groups are de-protected by an alkaline hydrolysis as mentioned above to give the hydroxy styrene unit or the hydroxy vinyl naphthalene unit.

Illustrative example of the base used during the alkaline hydrolysis includes an aqueous ammonia and triethylamine. The reaction temperature thereof is −20 to 100° C., or preferably 0 to 60° C.; and the reaction time is 0.2 to 100 hours, or preferably 0.5 to 20 hours.

Here, the ratios of the repeating units "a", "b", "c", "d", and "e" are: $0 \le a \le 1.0$, $0 \le b \le 0.9$, $0 \le c \le 0.5$, $0 \le d \le 0.5$, and $0 \le e \le 0.5$; or especially $0.1 \le a \le 0.9$, $0.1 \le b \le 0.9$, $0 \le c \le 0.4$, $0 \le d \le 0.4$, and $0 \le e \le 0.4$; or preferably $0.15 \le a \le 0.8$, $0.2 \le b \le 0.8$, $0 \le c \le 0.3$, $0 \le d \le 0.3$, and $0 \le e \le 0.3$; or more preferably $0.20 \le a \le 0.7$, $0.25 \le b \le 0.7$, $0 \le c \le 0.25$, $0 \le d \le 0.25$, and $0 \le e \le 0.25$. Here, c and d satisfy: $c=c1+c2+c3$ and $d=d1+d2+d3+d4+d5$. In this case, totality of the repeating units "a" to "e" satisfies: $a+b+c+d+e=1$.

In the polymer of the component (A) used in the positive resist composition of the present invention, the weight-average molecular weight thereof is 1000 to 500000, or preferably 2000 to 30000. If the weight-average molecular weight is too small, heat resistance of the resist composition is deteriorated, while if it is too large, the alkaline-dissolvability is deteriorated whereby readily causing a phenomenon of a footing profile after patterning.

Meanwhile, the weight-average molecular weight (Mw) is a measured value in terms of polystyrene equivalent obtained by a gel permeation chromatography (GPC) using tetrahydrofurane as the solvent therein (the same shall apply hereinafter).

In the polymer of the component (A) used in the positive resist composition of the present invention, if the molecular weight distribution (Mw/Mn) of a multicomponent copolymer is wide, foreign matters may appear on a pattern after light exposure, or a pattern profile may be deteriorated, because a polymer of a low molecular weight and a polymer of a high molecular weight exist. In accordance with progress of miniaturization in the pattern rule, effects of the molecular weight and the molecular weight distribution as mentioned above are prone to be larger; and thus, the molecular weight distribution of a multicomponent copolymer to be used is preferably in the range of 1.0 to 2.0, or especially in the narrow dispersivity range of 1.0 to 1.5 to obtain a resist composition which can be suitably used in a fine pattern size.

Alternatively, two or more polymers of the component (A) having different composition ratios, molecular weight distributions, or molecular weights may be used.

The positive resist composition of the present invention is characterized in that, in addition to the polymer of the component (A), a substituted or an unsubstituted fluorescein novolak resin (hereinafter, also refer to as simply a fluorescein novolak resin) of the component (B) is blended therein to make the base resin thereof. Blending of the fluorescein novolak resin therein has an effect to suppress the substrate reflection because an appropriate absorption at 193 nm of the ArF excimer laser can be obtained. The novolak resin has a wide molecular weight distribution while a molecular weight itself is low; and thus, excellent implantation characteristics on a non-planar substrate can be obtained, generation of a subliming component and increase of acid diffusion can be made smaller as compared with the case of adding a monomer component, and adhesion property onto an inorganic substrate can be improved.

As to the substituted or unsubstituted fluorescein novolak resin of the component (B), the novolak resin having a repeating unit shown by the following general formula (2) is preferable,

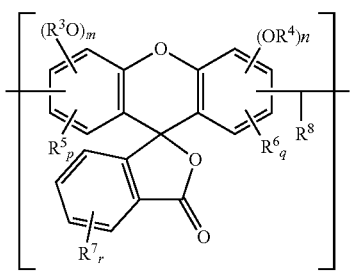

(2)

wherein $R^3$ and $R^4$ represent a hydrogen atom or an acid-labile group. $R^5$, $R^6$, and $R^7$ represent any of a hydrogen atom, a trifluoromethyl group, a hydroxyl group, a nitro group, a cyano group, and a halogen atom; a linear, a branched, or a cyclic alkyl group having 1 to 10 carbon atoms; an alkenyl group having 2 to 10 carbon atoms; and an aryl group having 6 to 10 carbon atoms, provided that the alkyl group, the alkenyl group, and the aryl group may optionally contain any of a hydroxyl group, an alkoxy group, an acyloxy group, an ether group, and a sulfide group. $R^8$ represents any of a hydrogen atom; a linear, a branched, or a cyclic alkyl group having 1 to 6 carbon atoms; an alkenyl group having 2 to 10 carbon atoms; a heteroaryl group having 4 to 10 carbon atoms; and an aryl group having 6 to 10 carbon atoms, provided that the alkyl group, the alkenyl group, the heteroaryl group, and the aryl group may optionally contain any of a hydroxyl group, an alkoxy group, an ether group, and a thioether group. m, n, p, q, and r represent 1 or 2.

Specific example of a fluorescein monomer to obtain the novolak resin having a repeating unit shown by the general formula (2) includes the followings.

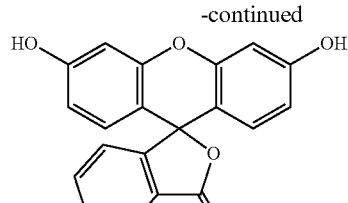

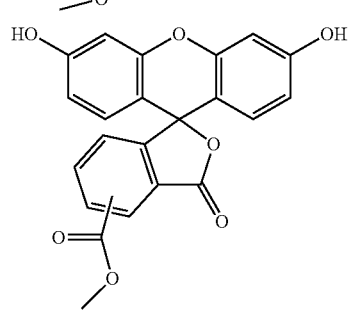

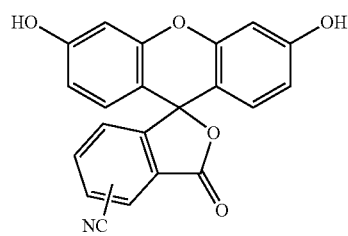

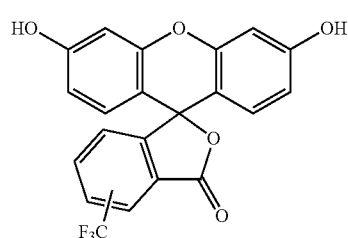

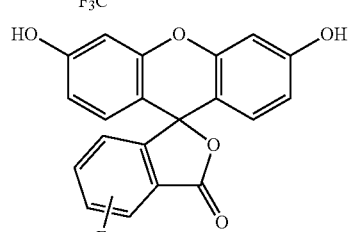

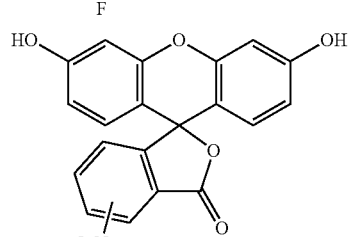

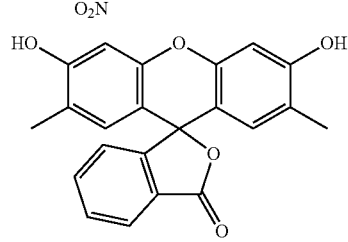

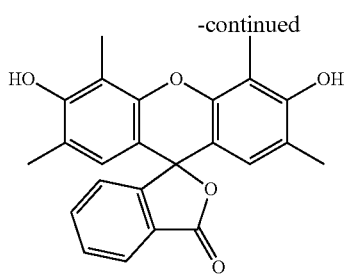

To form the novolak of a substituted or an unsubstituted fluorescein, other monomer may be co-condensed therewith. Specific example of the co-condensable monomer includes phenol, o-cresol, m-cresol, p-cresol, 2,3-dimethyphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluorene-9-ylidene)bisphenol, 2,2' dimethyl-4,4'-(9H-fluorene-9-ylidene)bisphenol, 2,2' diallyl-4,4'-(9H-fluorene-9-ylidene)bisphenol, 2,2' difluoro-4,4'-(9H-fluorene-9-ylidene)bisphenol, 2,2' diphenyl-4,4'-(9H-fluorene-9-ylidene)bisphenol, 2,2' dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, and 2,8-dihydroxynaphthalene. Illustrative example of the compound co-condensable with a dihydroxynaphthalene includes 1-naphthol, 2-naphthol, 2-methyl-1-naphthol, 4-methoxy-1-naphthol, 7-methoxy-2-naphthol, 6-methoxy-2-naphthol, 3-methoxy-2-naphthol, 1,4-dimethoxynaphthalene, 1,5-dimethoxynaphthalene, 1,6-dimethoxynaphthalene, 1,7-dimethoxynaphthalene, 1,8-dimethoxynaphthalene, 2,3-dimethoxynaphthalene, 2,6-dimethoxynaphthalene, 2,7-dimethoxynaphthalene, methyl 3-hydroxy-naphthalene-2-carboxylate, naphthalene, 1-methylnaphthalene, 2-methylnaphthalene, 1,2-dimethylnaphthalene, 1,3-dimethylnaphthalene, 1,4-dimethylnaphthalene, 1,5-dimethylnaphthalene, 1,6-dimethylnaphthalene, 1,7-dimethylnaphthalene, 1,8-dimethylnaphthalene, 2,3-dimethylnaphthalene, 2,6-dimethylnaphthalene, 2,7-dimethylnaphthalene, 1-ethylnaphthalene, 2-ethylnaphthalene, 1-propylnaphthalene, 2-propylnaphthalene, 1-butylnaphthalene, 2-butylnaphthalene, 1-phenylnaphthalene, 1-cyclohexylnaphthalene, 1-cyclopentylnaphthalene, 1,1'-bi(2-naphthol), o-cresol, m-cresol, p-cresol, indene, hydroxyanthracene, acenaphthylene, acenaphthene, biphenyl, bisphenol, trisphenol, dicyclopentadiene, 1,5-dimethyl-naphthalene, 6,6'-(9H-fluorene-9-ylidene)bis-2-naphthol, phenol phthalein, thimol phthalein, cresol phthalein, phenol red, thymol red, and cresol red.

If alkaline-dissolution rate of the novolak resin is too fast, film loss of a resist pattern occurs in a certain case. To decrease the alkaline-dissolution rate, co-condensation with a naphthol having one hydroxyl group, or with an alkoxy naphthalene or a dialkoxy naphthalene having the hydroxyl group thereof substituted with an alkoxy group, or substitution of a hydroxyl group of a fluorescein novolak resin with an acid-labile group is effective.

To form the novolak resin from a substituted or an unsubstituted fluorescein (fluoresceins), an aldehyde is added thereinto. By forming a novolak, the molecular weight thereof is increased so that generation of an out-going gas or a particle due to a low molecular weight body may be suppressed.

Illustrative example of the aldehyde usable herein includes formaldehyde, trioxane, paraformaldehyde, benzaldehyde, methoxy benzaldehyde, phenyl benzaldehyde, torityl benzaldehyde, cyclohexyl benzaldehyde, cyclopentyl benzaldehyde, t-butyl benzaldehyde, naphthalene aldehyde, hydroxynaphthalene aldehyde, anthracene aldehyde, fluorene aldehyde, pyrene aldehyde, methoxynaphthalene aldehyde, dimethoxynaphthalene aldehyde, acetoaldehyde, propylaldehyde, phenyl acetoaldehyde, naphthalene acetoaldehyde, substituted or unsubstituted carboxylnaphthalene acetoaldehyde, α-phenyl propylaldehyde, β-phenyl propylaldehyde, o-hydroxy benzaldehyde, m-hydroxy benzaldehyde, p-hydroxy benzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylnaphthalene, p-n-butylbenzaldehyde, furfral, furane carboxyaldehyde, and thiophene aldehyde. Among them, formaldehyde may be used especially suitably. These aldehydes may be used singly or in a combination of two or more of them.

Amount of the foregoing aldehyde to be used is preferably in the range of 0.2 to 5 moles, or more preferably 0.5 to 2 moles, relative to 1 mole of a fluorescein.

In the condensation reaction of a fluorescein and an aldehyde, a catalyst may also be used. Specific example thereof includes an acid catalyst such as hydrochloric acid, nitric acid, sulfuric acid, formic acid, oxalic acid, acetic acid, methanesulfonic acid, camphorsulfonic acid, tosyl acid, and trifluoromethanesulfonic acid.

Amount of these acid catalysts to be used is in the range of $1 \times 10^{-5}$ to $5 \times 10^{-1}$ moles relative to 1 mole of a fluorescein.

Molecular weight of the fluorescein novolak resin having a repeating unit shown by the general formula (2) of the component (B) is in the range of 400 to 20000, preferably 500 to 10000, or more preferably 600 to 10000, in terms of the weight-average molecular weight. If the molecular weight thereof is small, implantation characteristics are excellent while lithography characteristics are sometimes deteriorated due to increase of acid diffusion; and thus, it is desirable to optimize the molecular weight in view of implantation characteristics and lithography characteristics. One method to satisfy both implantation characteristics and lithography characteristics is to cut amount of an unpolymerized fluorescein as much as possible; and it is also desirable to reduce amounts of low-molecular weight dimer and trimer as much as possible.

Preferable blending ratio of the polymer of the component (A) which contains a repeating unit having a hydrogen atom of the carboxyl group thereof substituted with an acid-labile group having a cyclic structure and the novolak resin of a substituted or an unsubstituted fluorescein of the component (B) is 50 to 95% by mass in the polymer of the component (A) and 5 to 50% by mass in the fluorescein novolak resin of the component (B). The fluorescein novolak resin is alkaline-soluble; and thus, film loss of a resist pattern may take place after development in a certain case if the blending ratio thereof is too high. In addition, the fluorescein novolak resin absorbs a light of 193 nm wavelength; and thus, a resist pattern profile may become a tapered form after development in a certain case if the blending ratio thereof is too high. The blending ratio as mentioned above is preferable because there are no such risks.

The positive resist composition of the present invention contains a compound which generates an acid by reacting to a high energy beam (photo acid generator). As to the photo acid generator ingredient, any compound may be used as far as it can generate an acid by exposure to a high energy beam. Illustrative example of the preferable photo acid generator includes an acid generator with a type of a sulfonium salt, an iodonium salt, a sulfonyl diazomethane, an N-sulfonyl oxyimide, and an oxime-O-sultanate and so on; and these may be used singly or as a mixture of two or more of them.

Specific examples of the photo acid generator are described in the paragraphs [0122] to [0142] of the Japanese Patent Laid-Open Publication No. 2008-111103.

An onium salt, such as a sulfonium salt, an iodonium salt, and an ammonium salt, of a sulfonic acid whose α-position is not fluorinated and a carboxylic acid, which are described in the Japanese Patent Laid-Open Publication No. 2008-158339, may also be used as a quencher. A sulfonic acid, an imidic acid, and a methide acid, the α-position thereof being fluorinated, are necessary to de-protect an acid-labile group of a carboxylate ester, wherein a sulfonic acid whose α-position is not fluorinated and a carboxylic acid are released by salt-exchange with an onium salt of a sulfonic acid whose α-position is not fluorinated. A sulfonic acid whose α-position is not fluorinated and a carboxylic acid do not cause the de-protection reaction; and thus, they function as a quencher. Especially a sulfonium salt and an iodonium salt of a sulfonic acid whose α-position is not fluorinated and of a carboxylic acid are photo-decomposable; and thus, a quenching power thereof in the part of a high optical intensity is decreased while concentration of a sulfonic acid, an imidic acid, or a methide acid, the α-position thereof being fluorinated, is increased. With this, contrast of the exposed part can be increased. The onium salt such as a sulfonium salt, an iodonium salt, and an ammonium salt of a sulfonic acid whose α-position is not fluorinated and of a carboxylic acid is highly effective to suppress diffusion of a sulfonic acid, an imidic acid, and a methide acid, having the α-position thereof fluorinated. This is because molecular weight of the onium salt after exchange is increased thereby making mobility thereof decreased. Addition of an onium salt such as a sulfonium salt, an iodonium salt, and an ammonium salt of a sulfonic acid whose α-position is not fluorinated and of a carboxylic acid, as well as addition of a carbamate which generates an amine compound by an acid is important from a viewpoint of control of acid diffusion.

The resist composition of the present invention may optionally contain further any one or more of an organic solvent, a basic compound, a surfactant, a dissolution-controlling agent, and an acetylene alcohol.

Specific example of the organic solvent includes those described in the paragraphs of [0144] to [0145] in the Japanese Patent Laid-Open Publication No. 2008-111103; that of the basic compound in the paragraphs of [0146] to [0164] described therein; that of the surfactant in the paragraphs of [0165] to [0166] described therein; that of the dissolution-controlling agent in the paragraphs of [0155] to [0178] in the Japanese Patent Laid-Open Publication No. 2008-122932; and that of the acetylene alcohol in the paragraphs of [0179] to [0182] described therein. In addition, a compound which can generate an amine by an acid may be added thereinto; or a compound having a carbamate group, such as those described in the Japanese Patent No. 3790649, may also be used. In addition, a quencher of a polymer type described in the Japanese Patent Laid-Open Publication No. 2008-239918 may also be added thereinto. This enhances rectangularity of the resist after patterning by orientating thereof on resist surface after coating. The quencher of a polymer type has an effect to avoid film loss of a pattern or rounding of a pattern top when a top coat for an immersion exposure is used.

Meanwhile, amount of the photo acid generator to be blending is preferably in the range of 0.01 to 100 parts by mass, or in particular 0.1 to 80 parts by mass, relative to 100 parts by mass of the base resins (the foregoing polymer (A) and fluorescein novolak resin (B)); the blending amount of the organic solvent is preferably in the range of 50 to 10,000 parts by mass, or in particular 100 to 5000 parts by mass, relative to 100 parts by mass of the base resins. In addition, preferable amount of the dissolution-controlling agent is in the range of 0 to 50 parts by mass, or in particular 0 to 40 parts by mass; that of the basic compound in the range of 0 to 100 parts by mass, or in particular 0.001 to 50 parts by mass; and that of the surfactant in the range of 0 to 10 parts by mass, or in particular 0.0001 to 5 parts by mass, relative to 100 parts by mass of the base resins.

The positive resist composition of the present invention, especially the chemically amplified positive resist composition, as mentioned above, can be used, for example, not only for lithography in formation of a semiconductor circuit but also for formation of a mask circuit pattern, a micromachine, or a thin-film magnetic head circuit.

The positive resist composition of the present invention may be applied, though not particularly restricted, to a heretofore known lithography technology when this is used as a chemically amplified positive resist composition which is used for manufacturing of a variety of integrated circuits and contains, for example, an organic solvent, a polymer which contains a repeating unit "a" preferably shown by the general formula (1), a fluorescein novolak resin preferably shown by the general formula (2), a photo acid generator, and a basic compound.

In the patterning process of the present invention, for example, the positive resist composition of the present invention is applied onto a substrate for manufacturing of an integrated circuit (Si, $SiO_2$, SiN, SiON, TiN, WSi, BPSG, SOG, organic anti-reflection coat, and so on) or onto a substrate for manufacturing of a mask circuit (Cr, CrO, CrON, MoSi, and so on) by an appropriate coating method such as a spin coating, a roll coating, a flow coating, a dip coating, a spray coating, and a doctor coating in such a manner that a coated film thickness of 0.1 to 2.0 µm may be obtained. This is pre-baked on a hot plate at 60 to 150° C. for 10 seconds to 30 minutes, or preferably at 80 to 120° C. for 30 seconds to 20 minutes.

When used in the ion implantation process, a Si substrate is used as the base substrate in many cases. Having an organic anti-reflection coating (BARC) between a resist film and a substrate is effective to increase adhesion of the resist film thereby inhibiting pattern fall; but because an opening portion of a resist pattern is covered with the BARC film so that ion cannot be implanted thereonto. Accordingly, a resist film for ion implantation is formed directly on a Si substrate. Because of this, not only large reflection from the base substrate but also decrease of adhesion to cause pattern fall becomes a problem.

To increase adhesion, treatment of a substrate with hexamethyl disilazane (HMDS) is effective. By decomposition of HMDS thereby transforming a substrate silanol to a trimethyl silyl group, hydrophobicity of the substrate is increased; and this increases adhesion of the substrate because surface energy thereof becomes in the same level as the resist film.

Alternatively, an anti-reflection film (top coat) may be formed on a resist film. As to the top coat, a water-soluble top coat is mainly used because it does not undergo intermixing with a resist film and it can be removed during development. Alternatively, a top coat having high water-repellency used for an immersion light exposure as mentioned later may be formed. This top coat for an immersion method may be used not only in immersion exposure but also in dry exposure.

Then, an intended pattern is exposed directly or through a prescribed mask by using a light source of a high energy beam selected from a UV beam, a far UV beam, an electron beam, an X-ray beam, an excimer laser, a γ-beam, a synchrotron radiation beam, a vacuum UV beam (soft X-ray beam), and so on. Light exposure is done such that exposure dose may be preferably in the range of about 1 to about 200 mJ/cm$^2$, in particular 10 to 100 mJ/cm$^2$, or about 0.1 to about 100 μC/cm$^2$, in particular 0.5 to 50 μC/cm$^2$. Then, post-exposure bake (PEB) is done on a hot plate at 60 to 150° C. for 10 seconds to 30 minutes, or preferably at 80 to 120° C. for 30 seconds to 20 minutes.

Then, development is done by a conventional method such as a dip method, a puddle method, and a spray method for 3 seconds to 3 minutes, or preferably for 5 seconds to 2 minutes by using developer of an aqueous solution of a base such as tetramethyl ammonium hydroxide (TMAH) with the concentration thereof being in the range of 0.1 to 15% by mass, or preferably 2 to 10% by mass, tetraethyl ammonium hydroxide (TEAH), tetrapropyl ammonium hydroxide (TPAH), tetrabutyl ammonium hydroxide (TBAH), corrin hydroxide, morpholine, trimethylamine, triethylamine, ethanolamine, diethanolamine, triethanolamine, ammonia, sodium hydroxide, and potassium hydroxide, whereby an exposed part is dissolved into a developer while an unexposed part is not dissolved thereby forming an intended positive pattern on a substrate.

Meanwhile, the positive resist composition of the present invention is especially suitable for fine patterning by an excimer laser, an electron beam, a vacuum UV beam (soft X-ray beam), an X-ray beam, a γ-beam, and a synchrotron radiation beam among high energy beams; however, among the fine patterning by the afore-mentioned beams, fine patterning by an ArF excimer laser beam of 193 nm is most suitable. Patterning by an ArF excimer laser may be performed by any of a dry exposure wherein an air or a nitrogen gas is present between a lens and a wafer and an immersion exposure wherein a liquid is inserted therebetween.

In an ArF immersion lithography, a liquid which is highly transparent at the exposure wavelength and has a refractive index of one or more, such as pure water and an alkane, is used as an immersion solvent. In the immersion lithography, pure water or other liquid is inserted between a lens and a resist film after prebaking. With this, lens design with NA of 1.0 or more becomes possible so that further finer patterning may become possible. The immersion lithography is an important technology to prolong a life of the ArF lithography to the 45-nm node. In the immersion exposure, rinsing with pure water may be performed after exposure to remove a water droplet remained on the resist film (post-soaking), or a top coat may be formed on the resist film after prebake to avoid elution from the resist film and to improve water-repellency on the film surface. As to the top coat of the resist film used in the immersion lithography, for example, a material which contains, as a base, a polymer that is insoluble in water but soluble in an alkaline developer and has a 1,1,1,3,3,3-hexafluoro-2-propanol residue, and which is dissolved into an alcohol solvent having 4 or more carbon atoms, or an ether solvent having 8 to 12 carbon atoms, or mixture of them, is preferable. After formation of the resist film, rinsing with pure water may be performed to extract an acid generator from the film surface or to wash-out a particle; or rinsing may be performed to remove water remained on the film after light exposure (post-soaking).

Into the resist composition, an additive may also be added to improve water-repellency on the resist surface. This is a polymer having a fluoroalcohol group thereby lowers a surface energy by orientating on the resist surface after spin coating to improve water-repellency. The material like this is shown in the Japanese Patent Laid-Open Publication Nos. 2007-297590 and 2008-122932. The water-repellency improver as mentioned above is an indispensable additive in the immersion exposure not using a top coat; but this may be added in the case of dry exposure as well. By covering the resist surface after spin coating with a water-repellency improver, evaporation of an acid and an amine and reattachment thereof may be avoided thereby enabling to prohibit a chemical flare from occurring.

To terminate the development, rinsing with pure water is carried out; and to dry the rinse solution, spin drying is carried out. Sometimes pattern fall may occur in the drying process by spin drying. To reduce a shear stress during drying, a rinsing solution added with a surfactant may be used.

After patterning by development, the pattern may be subjected to a thermal flow by baking. With this, size of a hole pattern can be shrunk.

Then, in the case of carrying out an ion implantation, an ion is implanted by using a resist pattern after development as a mask. An ion of boron, phosphorous, or arsenic is implanted. As to the dopant gas, $BF_3$, $PH_3$, or $AsH_3$ is used; implantation thereof is carried out by using a resist pattern as a mask with the acceleration rate of several Kev to several MeV. Accordingly, the resist film needs to have a resistance to implantation of these ions.

It is said that there is a certain relationship between ion implantation resistance and etching resistance using a fluorocarbon gas. Etching resistance and ion implantation resistance are lower in the KrF resist composition based on a hydroxy styrene as compared with the i-line resist composition based on a novolak resin; and etching resistance and ion implantation resistance are lower in the ArF resist composition based on an alicyclic structure as compared with the KrF resist composition. In the ArF resist composition, an alicyclic structure alone is short of ion implantation resistance; and thus, the resistance thereof needs to be enhanced. The positive resist composition of the present invention has ion implantation resistance; and thus, ion implantation can be performed without problems.

EXAMPLES

Hereinafter, the present invention will be explained specifically by showing Examples and Comparative Examples; but the present invention is not limited to the following Examples. Meanwhile, weight-average molecular weight (Mw) is the polystyrene-equivalent weight-average molecular weight measured with a GPC which uses tetrahydrofuran as a solvent.

Synthesis Example 1

Synthesis of Polymers

Respective monomers were combined and copolymerized in tetrahydrofuran (THF) solvent; and then, a product thereof was precipitated out into methanol, washed repeatedly with hexane, isolated, and then dried to obtain respective polymers having following compositions (Polymer 1 to Polymer 12 and Comparative Polymer 1) which was used for the positive resist composition. Composition of the polymer thus obtained was confirmed with $^1$H-NMR, and molecular weight and dispersivity thereof with a gel permeation chromatography which uses a THF solvent.

Polymer 1:
 Molecular weight (Mw): 7300
 Dispersivity (Mw/Mn): 1.73

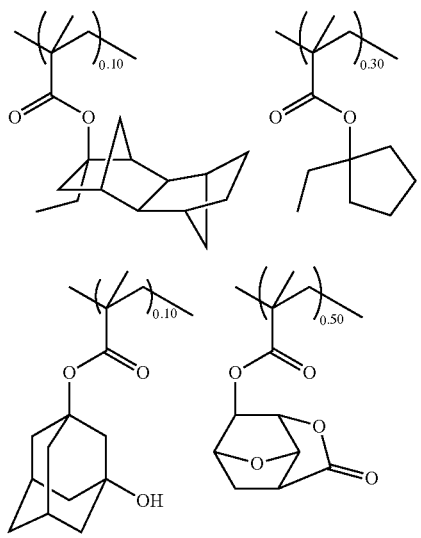

Polymer 1

Polymer 2:
 Molecular weight (Mw): 7100
 Dispersivity (Mw/Mn): 1.70

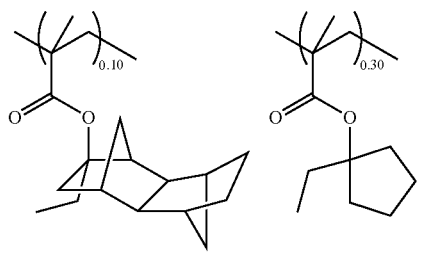

Polymer 2

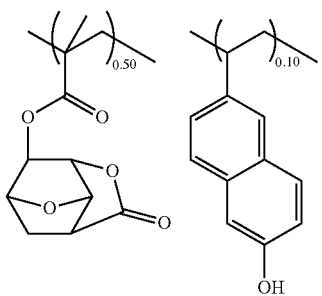

Polymer 3:
 Molecular weight (Mw): 6800
 Dispersivity (Mw/Mn): 1.76

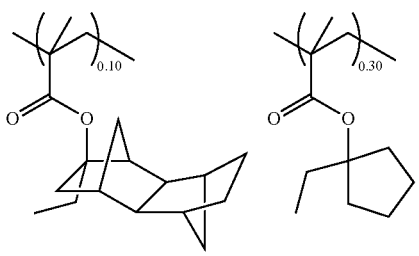

Polymer 3

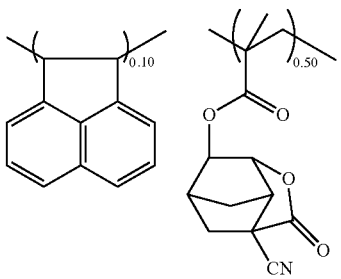

Polymer 4:
 Molecular weight (Mw): 9500
 Dispersivity (Mw/Mn): 1.91

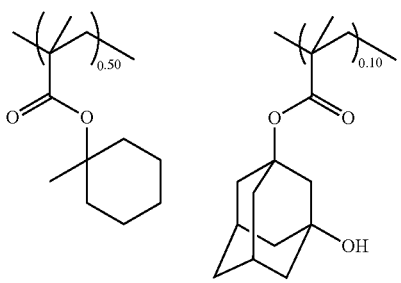

Polymer 4

-continued
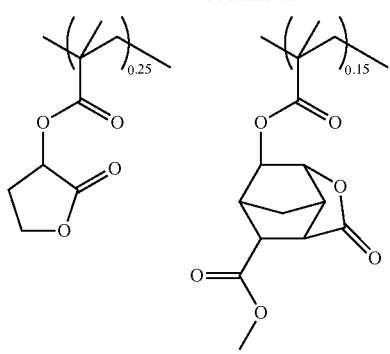
Polymer 5:
  Molecular weight (Mw): 8900
  Dispersivity (Mw/Mn): 1.89
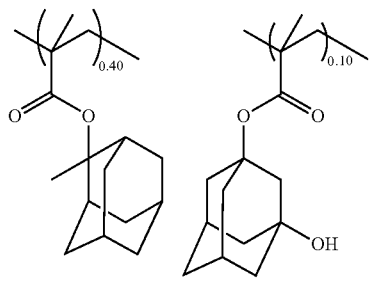
Polymer 6:
  Molecular weight (Mw): 7600
  Dispersivity (Mw/Mn): 1.69
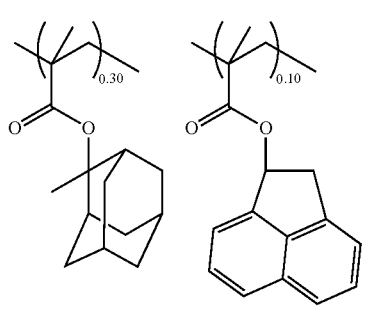
-continued
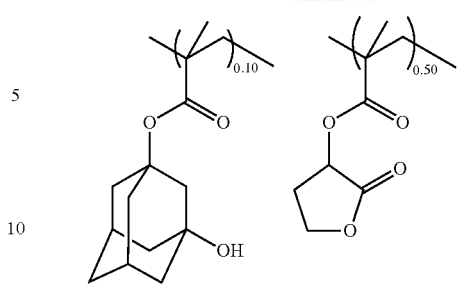
Polymer 7:
  Molecular weight (Mw): 6600
  Dispersivity (Mw/Mn): 1.98
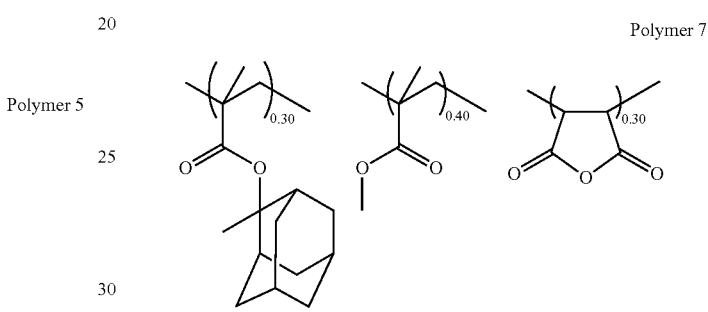
Polymer 8:
  Molecular weight (Mw): 6800
  Dispersivity (Mw/Mn): 1.93
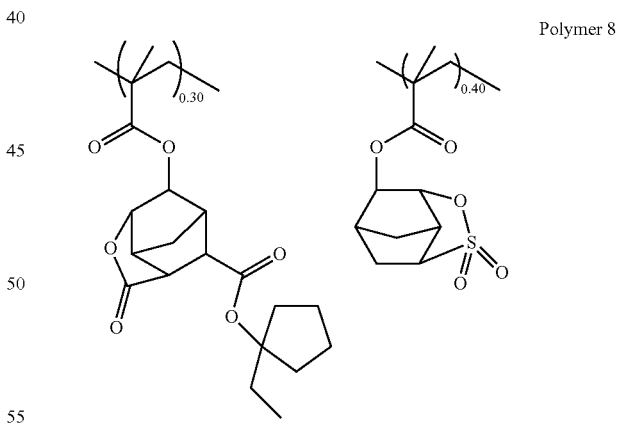
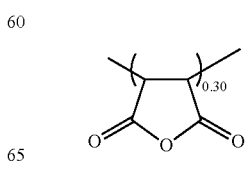

Polymer 9:
  Molecular weight (Mw): 7600
  Dispersivity (Mw/Mn): 1.69
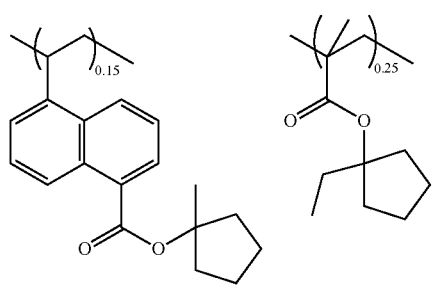
Polymer 9
Polymer 10:
  Molecular weight (Mw): 7900
  Dispersivity (Mw/Mn): 1.79
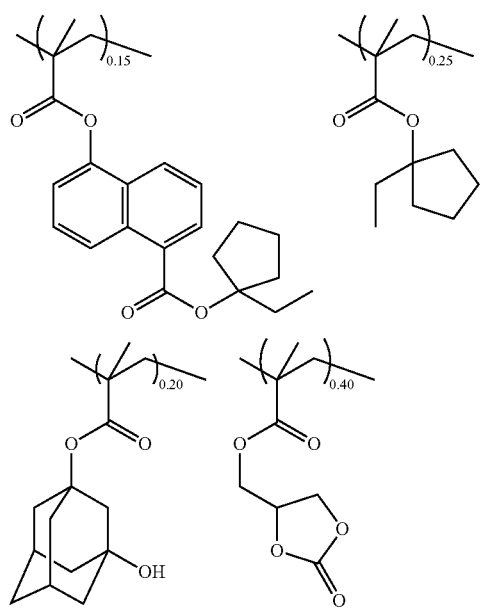
Polymer 10
Polymer 11:
  Molecular weight (Mw): 7300
  Dispersivity (Mw/Mn): 1.74
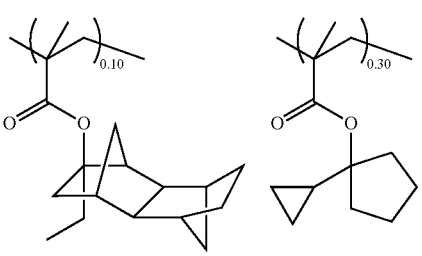
Polymer 11
Polymer 12:
  Molecular weight (Mw): 7700
  Dispersivity (Mw/Mn): 1.97
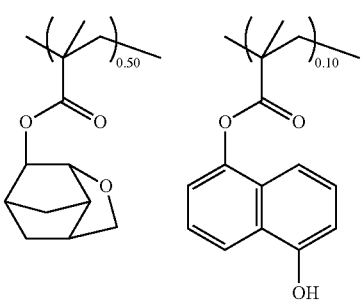
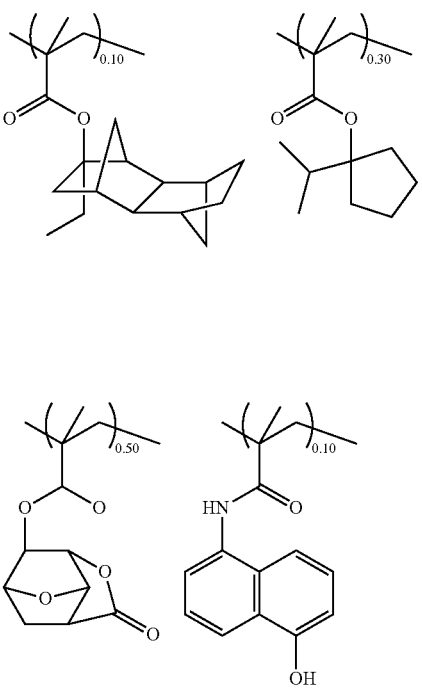
Polymer 12

Comparative Polymer 1:

Molecular weight (Mw): 9300

Dispersivity (Mw/Mn): 1.79

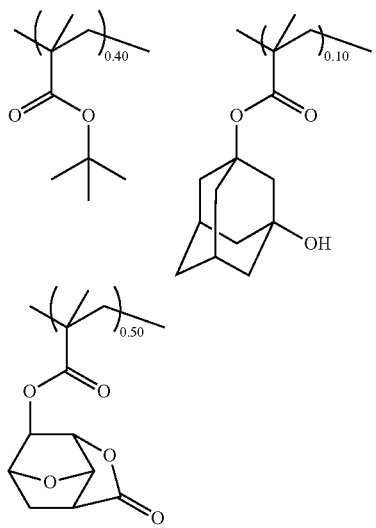

Comparative Polymer 1

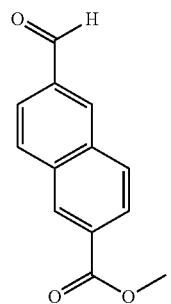

Aldehyde 1

Synthesis Example 2

Synthesis of Novolak Resins

A mixture of a fluorescein, other copolymerizable compound, an aqueous formalin having concentration of 37% by mass, and oxalic acid was stirred at 100° C. for 24 hours. After the reaction, the resulting mixture was dissolved into 500 mL of methyl isobutyl ketone, and then the catalyst and metal impurities were removed by sufficient washing with water; and after the solvent was removed under reduced pressure, evacuation was intensified to 2 mmHg at 150° C. to remove water and unreacted monomers thereby obtaining respective resins of Novolak Resin 1 to Novolak Resin 17, and in a similar manner, Comparative Novolak Resin 1 to Comparative Novolak Resin 2, as shown below.

Meanwhile, novolak resins were obtained; by changing the 37% by mass aqueous formalin solution to 6-hydroxy-2-naphthoaldehyde in the case of Novolak Resin 6; by changing the 37% by mass aqueous formalin solution to 3-furancarboxyaldehyde in the case of Novolak Resin 7; by changing the 37% by mass aqueous formalin solution to 3-thiophenaldehyde in the case of Novolak Resin 8; by changing the 37% by mass aqueous formalin solution to a 50% by mass dioxane solution of Aldehyde 1 shown below in the case of Novolak Resin 13; by changing the 37% by mass aqueous formalin solution to a 50% by mass dioxane solution of Aldehyde 2 shown below in the case of Novolak Resin 14; by changing the 37% by mass aqueous formalin solution to a 50% by mass dioxane solution of Aldehyde 3 shown below in the case of Novolak Resin 15; by changing the 37% by mass aqueous formalin solution to a 50% by mass dioxane solution of Aldehyde 4 shown below in the case of Novolak Resin 16; and by changing the 37% by mass aqueous formalin solution to a 50% by mass dioxane solution of Aldehyde 5 shown below in the case of Novolak Resin 17.

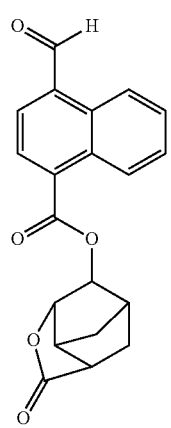

Aldehyde 2

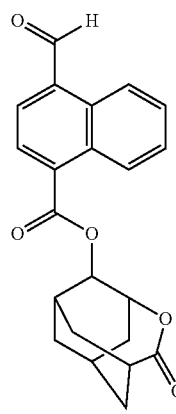

Aldehyde 3

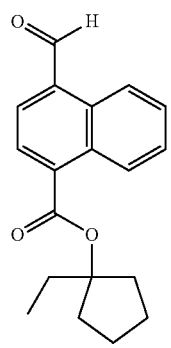

Aldehyde 4

-continued

Aldehyde 5

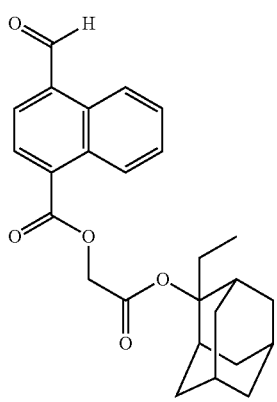

Novolak Resin 1:
  Molecular weight (Mw): 1500
  Dispersivity (Mw/Mn): 2.60

Novolak Resin 1

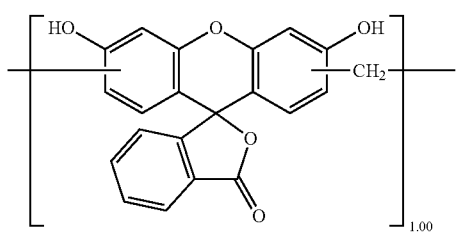

Novolak Resin 2:
  Molecular weight (Mw): 1900
  Dispersivity (Mw/Mn): 2.62

Novolak Resin 2

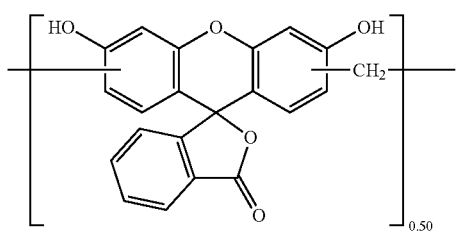

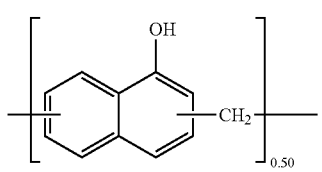

Novolak Resin 3:
  Molecular weight (Mw): 2100
  Dispersivity (Mw/Mn): 3.33

Novolak Resin 3

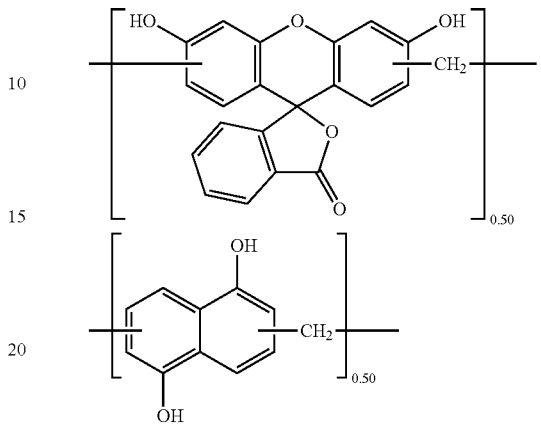

Novolak Resin 4:
  Molecular weight (Mw): 1600
  Dispersivity (Mw/Mn): 2.64

Novolak Resin 4

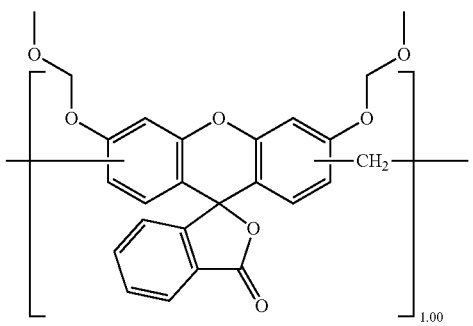

Novolak Resin 5:
  Molecular weight (Mw): 1900
  Dispersivity (Mw/Mn): 2.90

Novolak Resin 5

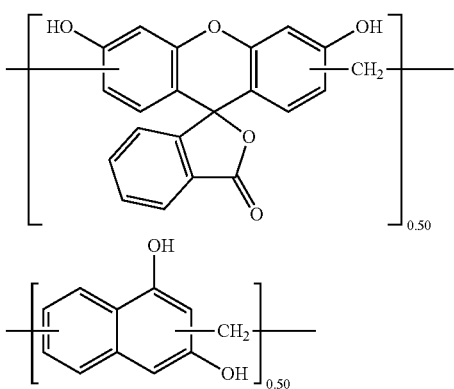

Novolak Resin 6:
Molecular weight (Mw): 2600
Dispersivity (Mw/Mn): 2.96
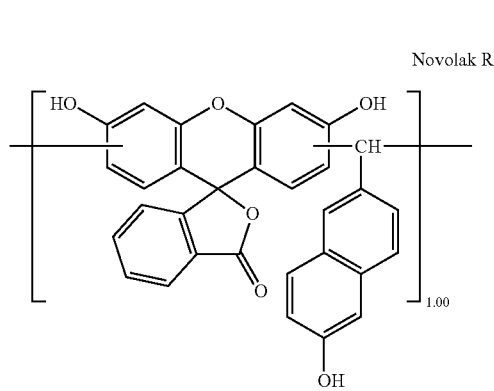
Novolak Resin 6
Novolak Resin 7:
Molecular weight (Mw): 2500
Dispersivity (Mw/Mn): 2.55
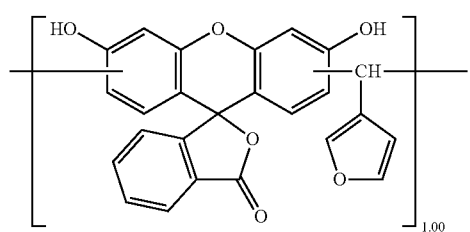
Novolak Resin 7
Novolak Resin 8:
Molecular weight (Mw): 2900
Dispersivity (Mw/Mn): 2.22
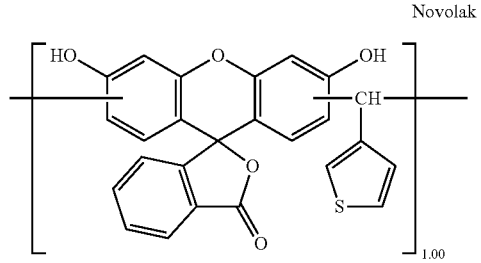
Novolak Resin 8
Novolak Resin 9:
Molecular weight (Mw): 1900
Dispersivity (Mw/Mn): 3.30
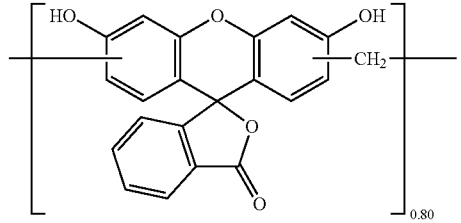
Novolak Resin 9
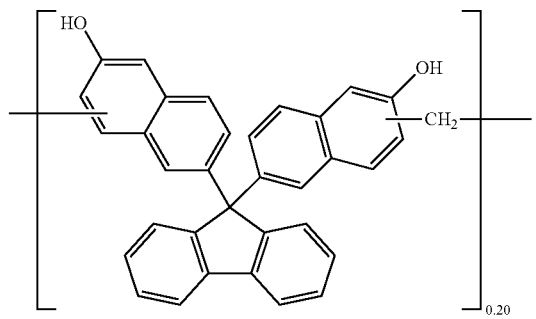
Novolak Resin 10:
Molecular weight (Mw): 3900
Dispersivity (Mw/Mn): 3.90
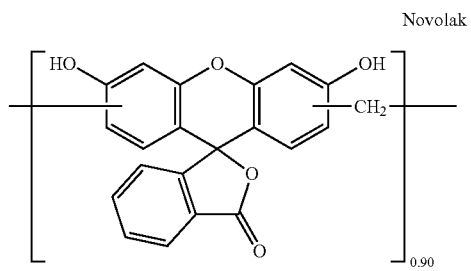
Novolak Resin 10
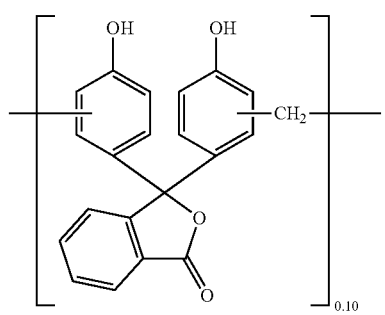

Novolak Resin 11:
  Molecular weight (Mw): 3300
  Dispersivity (Mw/Mn): 4.30

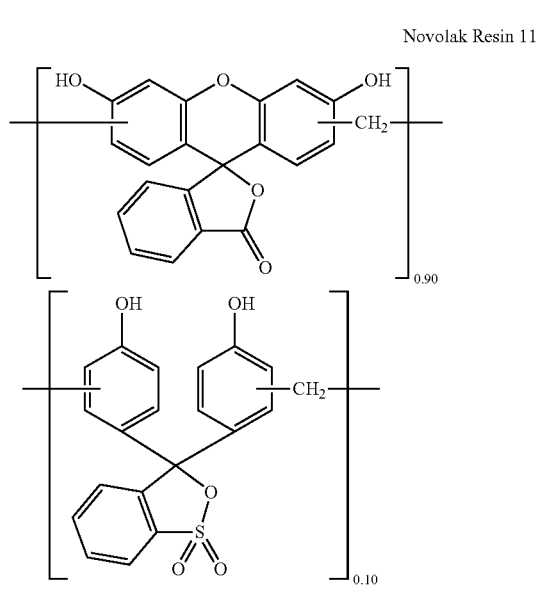
Novolak Resin 11

Novolak Resin 12:
  Molecular weight (Mw): 2500
  Dispersivity (Mw/Mn): 3.70

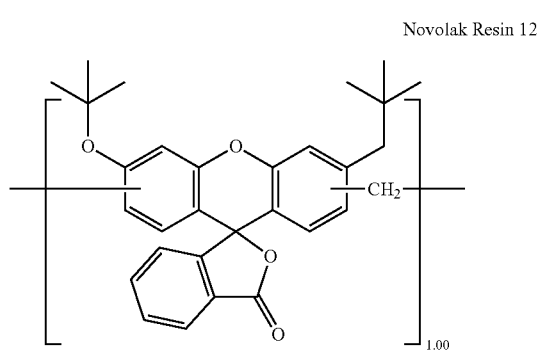
Novolak Resin 12

Novolak Resin 13:
  Molecular weight (Mw): 2200
  Dispersivity (Mw/Mn): 3.60

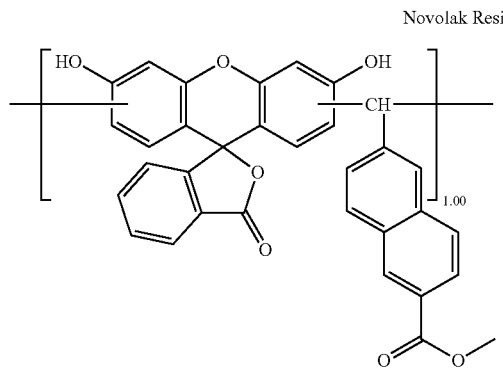
Novolak Resin 13

Novolak Resin 14:
  Molecular weight (Mw): 2300
  Dispersivity (Mw/Mn): 3.70

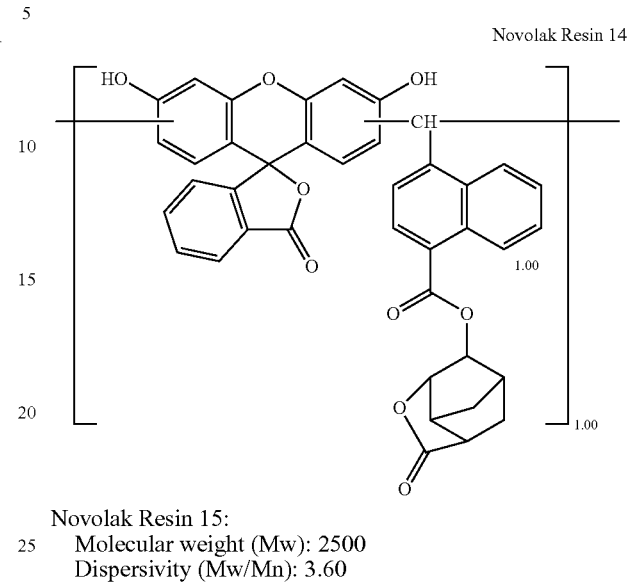
Novolak Resin 14

Novolak Resin 15:
  Molecular weight (Mw): 2500
  Dispersivity (Mw/Mn): 3.60

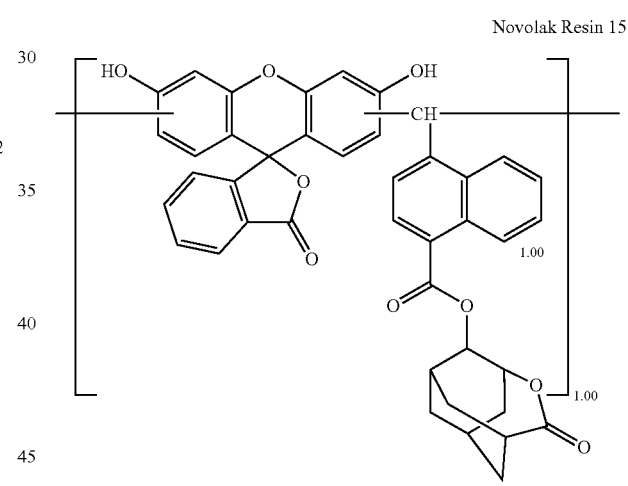
Novolak Resin 15

Novolak Resin 16:
  Molecular weight (Mw): 2800
  Dispersivity (Mw/Mn): 3.90

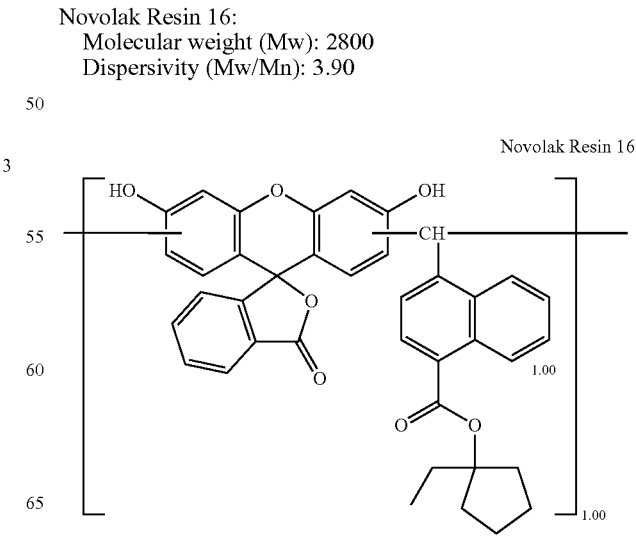
Novolak Resin 16

Novolak Resin 17:
 Molecular weight (Mw): 2900
 Dispersivity (Mw/Mn): 4.90

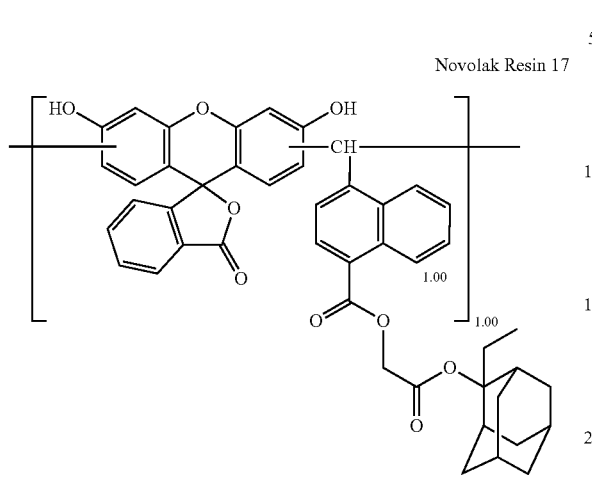

Comparative Novolak Resin 1:
 Molecular weight (Mw): 1800
 Dispersivity (Mw/Mn): 3.33

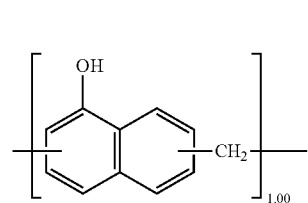

Comparative Novolak Resin 2:
 Molecular weight (Mw): 6900
 Dispersivity (Mw/Mn): 5.53

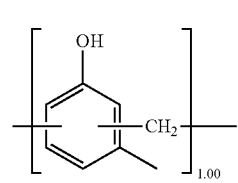

Examples 1 to 28 and Comparative Examples 1 to 6

A polymer and a novolak resin synthesized as mentioned above were dissolved with the composition shown in Tables 1 and 2 into a solvent in which a surfactant (FC-4430, manufactured by Sumitomo 3M Limited) was dissolved with concentration thereof being 100 ppm; and then, the resulting solution was passed through a filter with the size of 0.2 μm to obtain a positive resist composition.

Respective ingredients in Tables 1 and 2 are as following.
Polymers 1 to 12, Novolak Resins 1 to 17, Comparative Polymer 1, and Comparative Novolak Resins 1 to 2: these were obtained by the Synthesis Examples as described above.
Comparative Additives 1 and 2: see the structures shown below

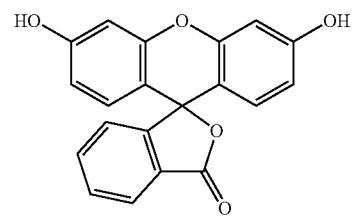

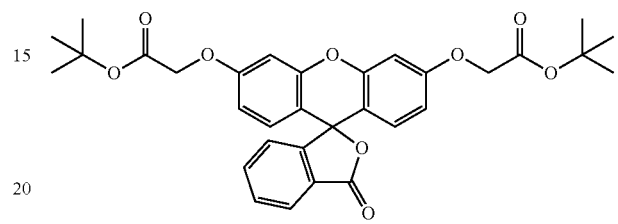

Organic solvent: PGMEA (propylene glycol monomethyl ether) and CyH (cyclohexanone)
Acid generator: PAG 1 to PAG 4 (see the structures shown below)

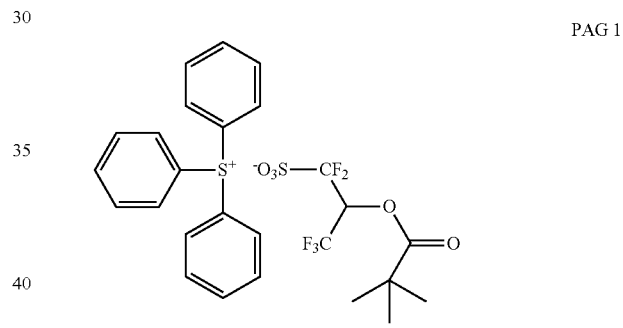

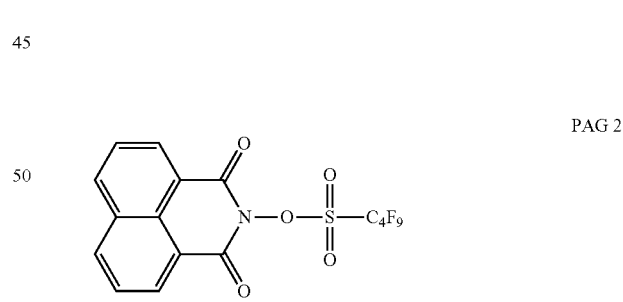

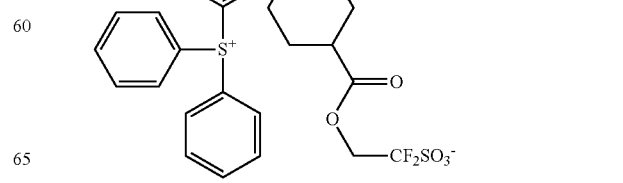

-continued

PAG 4

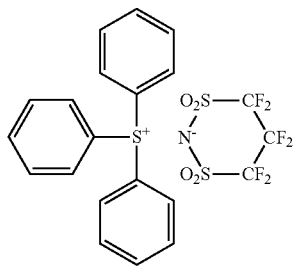

Basic compound: Quencher 1 to Quencher 4 (see the structures shown below)

Quencher 1

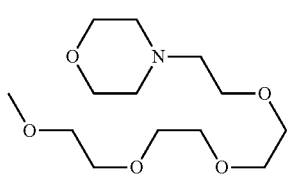

Quencher 2

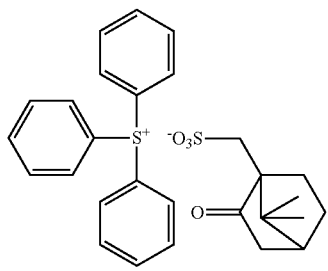

Quencher 3

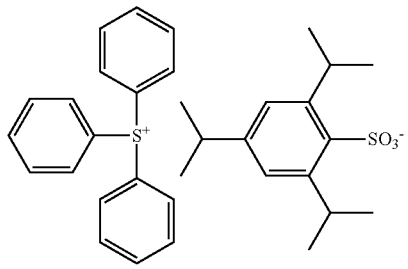

Quencher 4

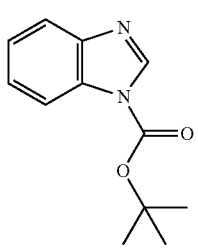

TABLE 1

| | Polymer (parts by mass) | Added resin (parts by mass) | Acid generator (parts by mass) | Basic compound (parts by mass) | Organic solvent (parts by mass) |
|---|---|---|---|---|---|
| Example 1 | Polymer 1 (80) | Novolak Resin 1 (20) | PAG 1 (4) | Quencher 1 (0.6) | PGMEA (1500), CyH (200) |
| Example 2 | Polymer 2 (85) | Novolak Resin 1 (15) | PAG 2 (4) | Quencher 2 (3.0) | PGMEA (1500), CyH (200) |
| Example 3 | Polymer 3 (85) | Novolak Resin 1 (15) | PAG 2 (4) | Quencher 4 (0.5) | PGMEA (1500), CyH (200) |
| Example 4 | Polymer 4 (80) | Novolak Resin 1 (20) | PAG 3 (4) | Quencher 1 (0.6) | PGMEA (1500), CyH (200) |
| Example 5 | Polymer 5 (80) | Novolak Resin 1 (20) | PAG 1 (4) | Quencher 1 (0.6) | PGMEA (1500), CyH (200) |
| Example 6 | Polymer 6 (80) | Novolak Resin 1 (20) | PAG 1 (4) | Quencher 1 (0.6) | PGMEA (1500), CyH (200) |
| Example 7 | Polymer 7 (65) | Novolak Resin 2 (35) | PAG 1 (4) | Quencher 2 (3.0) | PGMEA (1500), CyH (200) |
| Example 8 | Polymer 8 (60) | Novolak Resin 2 (40) | PAG 2 (4) | Quencher 3 (3.0) | PGMEA (1500), CyH (200) |
| Example 9 | Polymer 9 (85) | Novolak Resin 1 (15) | PAG 1 (4) | Quencher 1 (0.6) | PGMEA (1500), CyH (200) |
| Example 10 | Polymer 10 (85) | Novolak Resin 1 (15) | PAG 1 (4) | Quencher 1 (0.6) | PGMEA (1500), CyH (200) |
| Example 11 | Polymer 11 (85) | Novolak Resin 1 (15) | PAG 1 (4) | Quencher 1 (0.6) | PGMEA (1500), CyH (200) |
| Example 12 | Polymer 12 (85) | Novolak Resin 1 (15) | PAG 1 (4) | Quencher 1 (0.6) | PGMEA (1500), CyH (200) |
| Example 13 | Polymer 1 (80) | Novolak Resin 2 (20) | PAG 1 (4) | Quencher 1 (0.6) | PGMEA (1500), CyH (200) |
| Example 14 | Polymer 1 (80) | Novolak Resin 3 (20) | PAG 1 (4) | Quencher 1 (0.6) | PGMEA (1500), CyH (200) |
| Example 15 | Polymer 1 (80) | Novolak Resin 4 (20) | PAG 4 (4) | Quencher 1 (0.6) | PGMEA (1500), CyH (200) |
| Example 16 | Polymer 1 (80) | Novolak Resin 5 (20) | PAG 1 (4) | Quencher 3 (3.0) | PGMEA (1500), CyH (200) |
| Example 17 | Polymer 1 (80) | Novolak Resin 6 (20) | PAG 1 (4) | Quencher 1 (0.6) | PGMEA (1500), CyH (200) |
| Example 18 | Polymer 1 (80) | Novolak Resin 7 (20) | PAG 1 (4) | Quencher 1 (0.6) | PGMEA (1500), CyH (200) |
| Example 19 | Polymer 1 (80) | Novolak Resin 8 (20) | PAG 1 (4) | Quencher 1 (0.6) | PGMEA (1500), CyH (200) |
| Example 20 | Polymer 1 (80) | Novolak Resin 9 (20) | PAG 1 (4) | Quencher 1 (0.6) | PGMEA (1500), CyH (200) |

TABLE 2

| | Polymer (parts by mass) | Added resin (parts by mass) | Acid generator (parts by mass) | Basic compound (parts by mass) | Organic solvent (parts by mass) |
|---|---|---|---|---|---|
| Example 21 | Polymer 1 (80) | Novolak Resin 10 (20) | PAG 1 (4) | Quencher 1 (0.6) | PGMEA (1500), CyH (200) |
| Example 22 | Polymer 1 (80) | Novolak Resin 11 (20) | PAG 1 (4) | Quencher 1 (0.6) | PGMEA (1500), CyH (200) |

TABLE 2-continued

| | Polymer (parts by mass) | Added resin (parts by mass) | Acid generator (parts by mass) | Basic compound (parts by mass) | Organic solvent (parts by mass) |
|---|---|---|---|---|---|
| Example 23 | Polymer 1 (80) | Novolak Resin 12 (20) | PAG 1 (4) | Quencher 1 (0.6) | PGMEA (1500), CyH (200) |
| Example 24 | Polymer 1 (80) | Novolak Resin 13 (20) | PAG 1 (4) | Quencher 1 (0.6) | PGMEA (1500), CyH (200) |
| Example 25 | Polymer 1 (80) | Novolak Resin 14 (20) | PAG 1 (4) | Quencher 1 (0.6) | PGMEA (1500), CyH (200) |
| Example 26 | Polymer 1 (80) | Novolak Resin 15 (20) | PAG 1 (4) | Quencher 1 (0.6) | PGMEA (1500), CyH (200) |
| Example 27 | Polymer 1 (80) | Novolak Resin 16 (20) | PAG 1 (4) | Quencher 1 (0.6) | PGMEA (1500), CyH (200) |
| Example 28 | Polymer 1 (80) | Novolak Resin 17 (20) | PAG 1 (4) | Quencher 1 (0.6) | PGMEA (1500), CyH (200) |
| Comparative Example 1 | Comparative Polymer 1 (80) | Novolak Resin 1 (20) | PAG 1 (4) | Quencher 1 (0.6) | PGMEA (1500), CyH (200) |
| Comparative Example 2 | Polymer 1 (100) | — | PAG 1 (4) | Quencher 1 (0.6) | PGMEA (1500), CyH (200) |
| Comparative Example 3 | Polymer 1 (80) | Comparative Novolak Resin 1 (20) | PAG 1 (4) | Quencher 1 (0.6) | PGMEA (1500), CyH (200) |
| Comparative Example 4 | Polymer 1 (80) | Comparative Novolak Resin 2 (20) | PAG 1 (4) | Quencher 1 (0.6) | PGMEA (1500), CyH (200) |
| Comparative Example 5 | Polymer 1 (80) | Comparative Additive 1 (20) | PAG 1 (4) | Quencher 1 (0.6) | PGMEA (1500), CyH (200) |
| Comparative Example 6 | Polymer 1 (80) | Comparative Additive 2 (20) | PAG 1 (4) | Quencher 1 (0.6) | PGMEA (1500), CyH (200) |

<ArF Exposure Experiment>

A resist composition shown in Tables 1 and 2 was spin-coated on a Si substrate which was treated with a vapor primer of hexamethyl disilazane (HMDS), and then baked on a hot plate at 110° C. for 60 seconds to obtain a resist film having film thickness of 200 nm. This was exposed with the pattern of 90 nm lines and 180 nm pitches by using an ArF excimer laser scanner (NSR-S307E with NA of 0.85, σ of 0.93, 2/3 annular illumination, and 6% half tone phase shift mask, manufactured by Nikon Corporation); and then, immediately after light exposure, this was subjected to PEB at the temperature described in Tables 3 and 4 for 60 seconds, and then developed by an aqueous solution of 2.38% by mass of tetramethyl ammonium hydroxide for 30 seconds to obtain a 90 nm line-and-space pattern. Sensitivity and cross section form at this time were observed with SEM. The results thereof are shown in Tables 3 and 4.

TABLE 3

| | PEB Temperature (° C.) | Sensitivity (mJ/cm$^2$) | Cross section form |
|---|---|---|---|
| Example 1 | 100 | 25 | Rectangular form, no side-wall roughness |
| Example 2 | 100 | 29 | Rectangular form, no side-wall roughness |
| Example 3 | 100 | 33 | Rectangular form, no side-wall roughness |
| Example 4 | 110 | 33 | Rectangular form, no side-wall roughness |
| Example 5 | 120 | 28 | Rectangular form, no side-wall roughness |
| Example 6 | 120 | 28 | Rectangular form, no side-wall roughness |
| Example 7 | 120 | 35 | Rectangular form, no side-wall roughness |
| Example 8 | 100 | 39 | Rectangular form, no side-wall roughness |
| Example 9 | 100 | 29 | Rectangular form, no side-wall roughness |
| Example 10 | 95 | 27 | Rectangular form, no side-wall roughness |
| Example 11 | 100 | 27 | Rectangular form, no side-wall roughness |
| Example 12 | 100 | 29 | Rectangular form, no side-wall roughness |
| Example 13 | 100 | 23 | Rectangular form, no side-wall roughness |
| Example 14 | 100 | 24 | Rectangular form, no side-wall roughness |
| Example 15 | 100 | 34 | Rectangular form, no side-wall roughness |
| Example 16 | 100 | 23 | Rectangular form, no side-wall roughness |
| Example 17 | 100 | 27 | Rectangular form, no side-wall roughness |
| Example 18 | 110 | 28 | Rectangular form, no side-wall roughness |
| Example 19 | 110 | 29 | Rectangular form, no side-wall roughness |
| Example 20 | 110 | 35 | Rectangular form, no side-wall roughness |
| Example 21 | 110 | 35 | Rectangular form, no side-wall roughness |
| Example 22 | 110 | 37 | Rectangular form, no side-wall roughness |
| Example 23 | 110 | 35 | Rectangular form, no side-wall roughness |
| Example 24 | 110 | 35 | Rectangular form, no side-wall roughness |
| Example 25 | 110 | 30 | Rectangular form, no side-wall roughness |
| Example 26 | 110 | 31 | Rectangular form, no side-wall roughness |
| Example 27 | 110 | 33 | Rectangular form, no side-wall roughness |
| Example 28 | 110 | 38 | Rectangular form, no side-wall roughness |

TABLE 4

| | PEB Temperature (° C.) | Sensitivity (mJ/cm$^2$) | Cross section form |
|---|---|---|---|
| Comparative Example 1 | 130 | 42 | Tapered form with some film loss |
| Comparative Example 2 | 100 | 34 | Large side-wall irregularity by standing wave |
| Comparative Example 3 | 100 | 31 | Rectangular form, side-wall irregularity, some residues in a space portion |
| Comparative Example 4 | 100 | 45 | Eminently tapered form with some residues in a space portion |

TABLE 4-continued

|  | PEB Temperature (° C.) | Sensitivity (mJ/cm²) | Cross section form |
|---|---|---|---|
| Comparative Example 5 | 100 | 16 | Tapered form with some film loss |
| Comparative Example 6 | 100 | 13 | Tapered form with some film loss |

<Etching Test in the $CF_4/CHF_3$ Gas System>

A resist composition shown in Tables 1 and 2 were applied onto a silicon substrate, and baked at 110° C. for 60 seconds to form a resist film having film thickness of 200 nm, which was then subjected to an etching test in the $CF_4/CHF_3$ gas system under the conditions shown below. Meanwhile, difference in film thickness of the polymer film before and after the etching was measured by using a dry etching instrument (TE-8500, manufactured by Tokyo Electron Limited), so that etching rate per one minute was obtained. The results are shown in Tables 5 and 6.

Etching conditions in the test are as following.
Chamber pressure: 40.0 Pa
RF power: 1000 W
$CHF_3$ gas flow rate: 30 mL/minute
$CF_4$ gas flow rate: 30 mL/minute
Ar gas flow rate: 100 mL/minute
Time: 60 seconds <Resist Adhesion Test>

A resist composition shown in Table 1 and Table 2 was applied by spin coating onto a Si substrate not treated with a vapor primer of hexamethyl disilazane (HMDS), and then baked on a hot plate at 110° C. for 60 seconds to form a resist film having film thickness of 200 nm. This was exposed with the pattern of 300 nm lines and 600 nm pitches by using an ArF excimer laser scanner (NSR-S307E with NA of 0.85, σ of 0.93, conventional illumination, and a binary mask, manufactured by Nikon Corporation); and then, immediately after light exposure, this was subjected to PEB at the temperature described in Tables 3 and 4 for 60 seconds, and then developed by an aqueous solution of 2.38% by mass of tetramethyl ammonium hydroxide for 30 seconds. Observation with an optical microscope was made on whether or not a 300 nm line-and-space pattern was delaminated. The results thereof are shown in Tables 5 and 6.

<Implanting Test>

Onto a non-planar substrate, having a hole pattern of $SiO_2$ film which is formed on a Si substrate and has film thickness of 300 nm, pitch of 360 nm, and diameter of 180 nm, was spin-coated a resist composition under the conditions such that a resist film having film thickness of 200 nm may be formed onto a planar substrate; and then, baking thereof was carried out by using a hot plate at 110° C. for 60 seconds. The substrate was cross-cut; and observation thereof with SEM was made to see whether or not the hole of the oxide film was buried down to its bottom with the resist film. The results thereof are shown in Tables 5 and 6.

TABLE 5

|  | Etching rate (nm/min) | Adhesion test | Implantation test |
|---|---|---|---|
| Example 1 | 124 | No pattern delamination | Implantation down to hole bottom, no problem |
| Example 2 | 116 | No pattern delamination | Implantation down to hole bottom, no problem |
| Example 3 | 115 | No pattern delamination | Implantation down to hole bottom, no problem |
| Example 4 | 127 | No pattern delamination | Implantation down to hole bottom, no problem |
| Example 5 | 125 | No pattern delamination | Implantation down to hole bottom, no problem |
| Example 6 | 124 | No pattern delamination | Implantation down to hole bottom, no problem |
| Example 7 | 128 | No pattern delamination | Implantation down to hole bottom, no problem |
| Example 8 | 124 | No pattern delamination | Implantation down to hole bottom, no problem |
| Example 9 | 121 | No pattern delamination | Implantation down to hole bottom, no problem |
| Example 10 | 125 | No pattern delamination | Implantation down to hole bottom, no problem |
| Example 11 | 123 | No pattern delamination | Implantation down to hole bottom, no problem |
| Example 12 | 125 | No pattern delamination | Implantation down to hole bottom, no problem |
| Example 13 | 127 | No pattern delamination | Implantation down to hole bottom, no problem |
| Example 14 | 125 | No pattern delamination | Implantation down to hole bottom, no problem |
| Example 15 | 128 | No pattern delamination | Implantation down to hole bottom, no problem |
| Example 16 | 126 | No pattern delamination | Implantation down to hole bottom, no problem |
| Example 17 | 126 | No pattern delamination | Implantation down to hole bottom, no problem |
| Example 18 | 129 | No pattern delamination | Implantation down to hole bottom, no problem |
| Example 19 | 126 | No pattern delamination | Implantation down to hole bottom, no problem |
| Example 20 | 118 | No pattern delamination | Implantation down to hole bottom, no problem |
| Example 21 | 126 | No pattern delamination | Implantation down to hole bottom, no problem |
| Example 22 | 128 | No pattern delamination | Implantation down to hole bottom, no problem |
| Example 23 | 122 | No pattern delamination | Implantation down to hole bottom, no problem |
| Example 24 | 126 | No pattern delamination | Implantation down to hole bottom, no problem |
| Example 25 | 127 | No pattern delamination | Implantation down to hole bottom, no problem |
| Example 26 | 129 | No pattern delamination | Implantation down to hole bottom, no problem |
| Example 27 | 123 | No pattern delamination | Implantation down to hole bottom, no problem |
| Example 28 | 122 | No pattern delamination | Implantation down to hole bottom, no problem |

TABLE 6

|  | Etching rate (nm/min) | Adhesion test | Implantation test |
|---|---|---|---|
| Comparative Example 1 | 145 | No pattern delamination | Implantation down to hole bottom, no problem |
| Comparative Example 2 | 138 | Pattern delamination | No implantation down to hole bottom |
| Comparative Example 3 | 123 | Pattern delamination | Implantation down to hole bottom, no problem |
| Comparative Example 4 | 133 | No pattern delamination | Implantation down to hole bottom, no problem |
| Comparative Example 5 | 133 | Pattern delamination | Implantation down to hole bottom, no problem |
| Comparative Example 6 | 133 | Pattern delamination | Implantation down to hole bottom, no problem |

From the results shown in Tables 3 to 6, in the resist composition using a (meth)acrylate polymer not containing an acid-labile group which has a cyclic structure (Comparative Example 1), dissolution-preventing power of the acid-labile group was insufficient thereby forming a tapered pattern after development; and in addition, etching resistance thereof (namely, ion implantation resistance) was low. In the case of not blended with a fluorescein novolak resin (Comparative Example 2), implantation characteristics and adhesion were insufficient. In the case of blended with a hydroxyl naphthalene novolak resin (Comparative Example 3), adhesion was insufficient, whereby leaving a residue in a space portion of the resist pattern after development. In the case of blended with a cresol novolak resin (Comparative Example 4), a vertical pattern could not be obtained in the ArF exposure because of strong absorption. In the case of blended with a fluorescein monomer (Comparative Examples 5 and 6), acid diffusion and alkaline-dissolution rate became too large whereby forming a tapered form of a resist pattern after development.

A positive resist composition of the present invention which is a blend of a fluorescein novolak resin with a (meth)acrylate polymer having a cyclic acid-labile group showed satisfactory resolution, sensitivity, pattern form, adhesion, etching resistance, and implantation characteristics; and thus, it became clear that the resist composition of the present invention has excellent properties as the resist composition for ion implantation process.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A positive resist composition comprising, as base resins contained therein, (A) a polymer having a weight-average molecular weight of 1000 to 500000 and containing a repeating unit which contains a structure having a hydrogen atom of a carboxyl group thereof substituted with an acid-labile group having a cyclic structure and (B) a novolak resin of a substituted or an unsubstituted fluorescein, and in addition, a photo acid generator.

2. The positive resist composition according to claim 1, wherein the repeating unit, which is contained in the polymer of the component (A) and contains a structure having a hydrogen atom of a carboxyl group thereof substituted with an acid-labile group having a cyclic structure, is a repeating unit "a" shown by the following general formula (1);

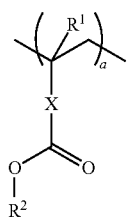

(1)

wherein $R^1$ represents a hydrogen atom or a methyl group; X represents a single bond, a naphthylene group, or a connecting group having 1 to 14 carbon atoms and containing one, or two or more groups selected from an ester group, an ether group, and a lactone ring; and $R^2$ represents the acid-labile group having a cyclic structure.

3. The positive resist composition according to claim 1, wherein the novolak resin of a substituted or an unsubstituted fluorescein of the component (B) is a resin having a repeating unit shown by the following general formula (2) and a weight-average molecular weight of 400 to 20000;

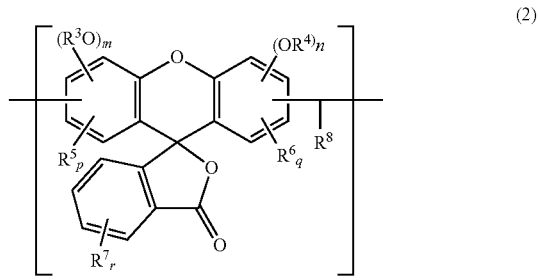

(2)

wherein $R^3$ and $R^4$ represent a hydrogen atom or an acid-labile group; $R^5$, $R^6$, and $R^7$ represent any of a hydrogen atom, a trifluoromethyl group, a hydroxyl group, a nitro group, a cyano group, a halogen atom, a linear, a branched, or a cyclic alkyl group having 1 to 10 carbon atoms, an alkenyl group having 2 to 10 carbon atoms, and an aryl group having 6 to 10 carbon atoms, provided that the alkyl group, the alkenyl group, and the aryl group may optionally contain any of a hydroxyl group, an alkoxy group, an acyloxy group, an ether group, and a sulfide group; $R^8$ represents any of a hydrogen atom, a linear, a branched, or a cyclic alkyl group having 1 to 6 carbon atoms, an alkenyl group having 2 to 10 carbon atoms, a heteroaryl group having 4 to 10 carbon atoms, and an aryl group having 6 to 10 carbon atoms, provided that the alkyl group, the alkenyl group, the heteroaryl group, and the aryl group may optionally contain any of a hydroxyl group, an alkoxy group, an ether group, and a thioether group; and m, n, p, q, and r represent 1 or 2.

4. The positive resist composition according to claim 2, wherein the novolak resin of a substituted or an unsubstituted fluorescein of the component (B) is a resin having a repeating unit shown by the following general formula (2) and a weight-average molecular weight of 400 to 20000;

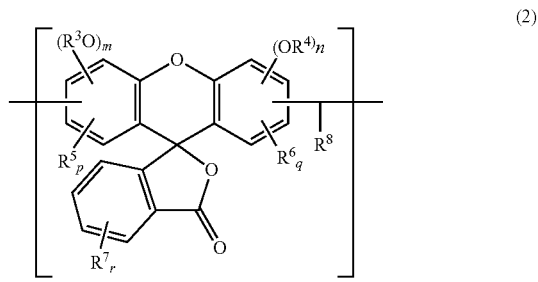

(2)

wherein $R^3$ and $R^4$ represent a hydrogen atom or an acid-labile group; $R^5$, $R^6$, and $R^7$ represent any of a hydrogen atom, a trifluoromethyl group, a hydroxyl group, a nitro group, a cyano group, a halogen atom, a linear, a branched, or a cyclic alkyl group having 1 to 10 carbon atoms, an alkenyl group having 2 to 10 carbon atoms, and an aryl group having 6 to 10 carbon atoms, provided that the alkyl group, the alkenyl group, and the aryl group may optionally contain any of a hydroxyl group, an alkoxy group, an acyloxy group, an ether group, and a sulfide group; $R^8$ represents any of a hydrogen atom, a linear, a branched, or a cyclic alkyl group having 1 to 6 carbon atoms, an alkenyl group having 2 to 10 carbon atoms, a heteroaryl group having 4 to 10 carbon atoms, and an aryl group having 6 to 10 carbon atoms, provided that the alkyl group, the alkenyl group, the heteroaryl group, and the aryl group may optionally contain any of a hydroxyl group, an alkoxy group, an ether group, and a thioether group; and m, n, p, q, and r represent 1 or 2.

5. The positive resist composition according to claim 3, wherein the component (A) is a polymer containing, in addition to the repeating unit "a" shown by the general formula (1), a repeating unit "b" which has an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, and an amide group with each molar ratio of the repeating unit "a" and the repeating unit "b" relative to entirety of the repeating units contained in the polymer being in the range of $0<a<1.0$, $0<b<1.0$, and $0.2 \leq a+b \leq 1.0$, and the component (B) is a novolak resin of a fluorescein having a repeating unit shown by the general formula (2).

6. The positive resist composition according to claim 4, wherein the component (A) is a polymer containing, in addition to the repeating unit "a" shown by the general formula (1), a repeating unit "b" which has an adhesion group selected from a hydroxyl group, a carboxyl group, a lactone ring, a carbonate group, a thiocarbonate group, a carbonyl group, a cyclic acetal group, an ether group, an ester group, a sulfonate ester group, a cyano group, and an amide group with each molar ratio of the repeating unit "a" and the repeating unit "b" relative to entirety of the repeating units contained in the polymer being in the range of $0<a<1.0$, $0<b<1.0$, and $0.2 \leq a+b \leq 1.0$, and the component (B) is a novolak resin of a fluorescein having a repeating unit shown by the general formula (2).

7. The positive resist composition according to claim 1, wherein the positive resist composition further contains an organic solvent.

8. The positive resist composition according to claim 1, wherein the positive resist composition further contains any one of a basic compound and a surfactant or both as an additive.

9. A patterning process wherein the process includes a step of applying the positive resist composition according to claim 1 onto a substrate; after heat treatment, a step of exposure to a high energy beam; and a step of development by using a developer.

10. A patterning process wherein the process includes a step of applying the positive resist composition according to claim 2 onto a substrate; after heat treatment, a step of exposure to a high energy beam; and a step of development by using a developer.

11. A patterning process wherein the process includes a step of applying the positive resist composition according to claim 3 onto a substrate; after heat treatment, a step of exposure to a high energy beam; and a step of development by using a developer.

12. A patterning process wherein the process includes a step of applying the positive resist composition according to claim 4 onto a substrate; after heat treatment, a step of exposure to a high energy beam; and a step of development by using a developer.

13. A patterning process wherein the process includes a step of applying the positive resist composition according to claim 5 onto a substrate; after heat treatment, a step of exposure to a high energy beam; and a step of development by using a developer.

14. A patterning process wherein the process includes a step of applying the positive resist composition according to claim 6 onto a substrate; after heat treatment, a step of exposure to a high energy beam; and a step of development by using a developer.

15. A patterning process wherein the process includes a step of applying the positive resist composition according to claim 7 onto a substrate; after heat treatment, a step of exposure to a high energy beam; and a step of development by using a developer.

16. A patterning process wherein the process includes a step of applying the positive resist composition according to claim 8 onto a substrate; after heat treatment, a step of exposure to a high energy beam; and a step of development by using a developer.

17. The patterning process according to claim 9, wherein an ArF excimer laser is used as the high energy beam.

18. The patterning process according to claim 9, wherein implantation of an ion onto the substrate is carried out after the step of development by using a developer.

19. The patterning process according to claim 17, wherein implantation of an ion onto the substrate is carried out after the step of development by using a developer.

* * * * *